US010672954B2

(12) United States Patent
Lim et al.

(10) Patent No.: US 10,672,954 B2
(45) Date of Patent: Jun. 2, 2020

(54) LIGHT EMITTING DEVICE PACKAGE

(71) Applicant: LG INNOTEK CO., LTD., Seoul (KR)

(72) Inventors: Chang Man Lim, Seoul (KR); Ki Seok Kim, Seoul (KR); Won Jung Kim, Seoul (KR); June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/766,717

(22) PCT Filed: Sep. 29, 2017

(86) PCT No.: PCT/KR2017/011084
§ 371 (c)(1),
(2) Date: Apr. 6, 2018

(87) PCT Pub. No.: WO2019/045166
PCT Pub. Date: Mar. 7, 2019

(65) Prior Publication Data
US 2019/0074410 A1    Mar. 7, 2019

(30) Foreign Application Priority Data
Sep. 1, 2017  (KR) .................. 10-2017-0111846

(51) Int. Cl.
*H01L 33/60* (2010.01)
*H01L 33/48* (2010.01)
(Continued)

(52) U.S. Cl.
CPC ...... *H01L 33/486* (2013.01); *H01L 23/49827* (2013.01); *H01L 33/52* (2013.01); *H01L 33/60* (2013.01); *H01L 33/62* (2013.01)

(58) Field of Classification Search
CPC ....... H01L 33/486; H01L 33/60; H01L 33/62; H01L 33/647; H01L 33/36;
(Continued)

(56) References Cited

U.S. PATENT DOCUMENTS 5,003,357 A    3/1991  Kim et al.
5,693,564 A   12/1997  Yu
(Continued)

FOREIGN PATENT DOCUMENTS

EP          2806471 A1    11/2014
JP       2017-76806 A     4/2017
(Continued)

*Primary Examiner* — Eric A. Ward
*Assistant Examiner* — Eric K Ashbahian
(74) *Attorney, Agent, or Firm* — Birch, Stewart, Kolasch & Birch, LLP

(57) ABSTRACT

A light emitting device package can include first and second frames spaced apart from each other; a package body including a body portion disposed between the first and second frames; a light emitting device including first and second electrode pads; a first through hole in the first frame; a second through hole in the second frame; a conductive material disposed in the first and second through holes; and an intermetallic compound layer disposed between the conductive material and the first frame, and between the conductive material and the second frame, in which the first electrode pad of the light emitting device overlaps with the first through hole in the first frame, the second electrode pad of the light emitting device overlaps with the second through hole in the second frame, and the first and second electrode pads are spaced apart from each other.

19 Claims, 17 Drawing Sheets

(51) Int. Cl.
  *H01L 33/52* (2010.01)
  *H01L 33/62* (2010.01)
  *H01L 23/498* (2006.01)
(58) Field of Classification Search
  CPC ... H01L 2224/0401; H01L 2224/73204; H01L 2224/32257; H01L 2224/16227; H01L 2224/16235; H01L 2224/17051; H01L 21/4846; H01L 21/486; H01L 21/4853; H01L 23/498; H01L 23/495–49894; H01L 24/32; H01L 2224/84345; H01L 23/49827
  See application file for complete search history.

(56) References Cited

U.S. PATENT DOCUMENTS

| | | |
|---|---|---|
| 9,761,516 B1 | 9/2017 | Knickerbocker et al. |
| 2008/0191227 A1 | 8/2008 | Kimura et al. |
| 2008/0224161 A1* | 9/2008 | Takada ............... H01L 33/486 257/98 |
| 2010/0207140 A1 | 8/2010 | Rudaz et al. |
| 2011/0169034 A1* | 7/2011 | Tseng ............... H01L 33/486 257/98 |
| 2012/0025227 A1 | 2/2012 | Chan et al. |
| 2012/0181555 A1* | 7/2012 | Yoo ............... H01L 33/486 257/91 |
| 2013/0193464 A1* | 8/2013 | Bae ............... H01L 33/405 257/94 |
| 2013/0307000 A1* | 11/2013 | Ikenaga ............... H01L 33/486 257/91 |
| 2014/0252402 A1* | 9/2014 | Lee ............... H01L 33/62 257/99 |
| 2014/0332839 A1 | 11/2014 | Choi et al. |
| 2015/0028372 A1 | 1/2015 | Nakanishi et al. |
| 2016/0056356 A1 | 2/2016 | Oh et al. |
| 2016/0201875 A1* | 7/2016 | Kang ............... G02B 19/0014 362/311.06 |
| 2017/0117446 A1* | 4/2017 | Tsuchiya ............... H01L 33/62 |
| 2017/0170105 A1* | 6/2017 | Yao ............... H01L 24/97 |
| 2019/0088837 A1* | 3/2019 | Lee ............... H01L 24/16 |

FOREIGN PATENT DOCUMENTS

| | | |
|---|---|---|
| KR | 10-2011-0136812 A | 12/2011 |
| KR | 10-2015-0078296 A | 7/2015 |
| KR | 10-2016-0046198 A | 4/2016 |
| KR | 10-2016-0057146 A | 5/2016 |

* cited by examiner

LIGHT EMITTING DEVICE PACKAGE

CROSS REFERENCE TO THE RELATED APPLICATIONS

This application is the National Phase of PCT International Application No. PCT/KR2017/011084, filed on Sep. 29, 2017, which claims priority under 35 U.S.C. § 119(a) to Patent Application No. 10-2017-0111846, filed in Republic of Korea on Sep. 1, 2017, all of which are hereby expressly incorporated by reference into the present application.

TECHNICAL FIELD

The embodiment relates to a semiconductor device package, a method of manufacturing the semiconductor device package, and a light source apparatus.

BACKGROUND ART

A semiconductor device including compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using group III-V or group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using group III-V or group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using the group III-V or group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

In addition, since a semiconductor device capable of providing a high output has been requested, studies on a semiconductor device capable of increasing an output power by applying a high-power source have been proceeding.

In addition, as for a semiconductor device package, studies on a method of improving the light extraction efficiency of a semiconductor device and improving the light intensity in a package stage have been proceeding. In addition, as for the semiconductor device package, studies on a method of improving bonding strength between a package electrode and a semiconductor device have been proceeding.

In addition, as for the semiconductor device package, studies on a method of reducing the manufacturing cost and improving the manufacturing yield by improving the process efficiency and changing the structure have been proceeding.

SUMMARY OF THE INVENTION

The embodiments may provide a semiconductor device package capable of improving the light extraction efficiency and electrical characteristics, a method of manufacturing the semiconductor device package, and a light source apparatus.

The embodiments may provide a semiconductor device package capable of reducing the manufacturing cost and improving the manufacturing yield, a method of manufacturing the semiconductor device package, and a light source apparatus.

Embodiments provide a semiconductor device package and a method of manufacturing a semiconductor device package that may prevent a re-melting phenomenon from occurring in a bonding region of the semiconductor device package during a process of re-bonding the semiconductor device package to a substrate or the like.

The light emitting device package according to the embodiment includes: a first frame including a first opening part provided through an upper surface and a lower surface of the first frame, and a second frame spaced apart from the first frame and including a second opening part; first and second conductive layers disposed in the first and second opening parts, respectively; a body disposed between the first and second frames; a first resin disposed on the body; and a light emitting device disposed on the first resin, in which the light emitting device includes a first bonding part electrically connected to the first frame and a second bonding part electrically connected to the second frame and spaced apart from the first bonding part, the first and second bonding parts are disposed on the first and second opening parts, respectively, and a first alloy layer formed of an alloy of the first conductive layer and the first frame may be disposed between the first conductive layer and the first frame.

According to the embodiment, a second alloy layer formed of an alloy of the second conductive layer and the second frame may be disposed between the second conductive layer and the second frame.

According to the embodiment, the first and second frames may include a support member and a first metal layer surrounding the support member.

According to the embodiment, the body may include a recess concavely provided in a direction from the upper surface to the lower surface of the body.

According to the embodiment, the first opening part includes an upper region formed adjacent to an upper surface of the first frame and a lower region provided adjacent to a lower surface of the first frame, and a periphery of the upper region of the first opening part may be smaller than a periphery of the lower region of the first opening part.

According to the embodiment, the first opening includes a first point where the first opening part has a smallest periphery in a first direction and the first point may be closer to the upper region of the first opening part than the lower region of the first opening part with reference to a direction perpendicular to the first direction.

According to the embodiment, the first resin may be disposed in the recess of the body.

According to the embodiment, the first and second frames may include a lower recess concavely provided in a direction from a lower surface toward an upper surface thereof.

The light emitting device package according to the embodiment may further include a resin layer disposed in the lower recess.

According to the embodiment, the light emitting device may further include first and second conductors having widths smaller than widths of the first and second bonding parts.

According to the embodiment, the first and second conductors may be disposed in the first and second opening parts, respectively.

The light emitting device package according to the embodiment includes a package body including a cavity; and a light emitting device disposed in the cavity. The package body, when viewed from the top of the package body, is provided in a square shape including a first outer side having a first length and arranged in parallel to a long axis direction of the light emitting device, and a second outer side having the first length arranged in parallel to a short axis direction of the light emitting device. The light emitting device, when viewed from the top of the package body, is provided in a rectangular shape having a length of at least 1000 micrometers in the long axis direction of the light emitting device. A bottom surface of the cavity, when viewed from the top of the package body, may be provided in a rectangular shape around the light emitting device.

The semiconductor device package and the method of manufacturing the semiconductor device package according to the embodiment can improve light extraction efficiency, electrical characteristics and reliability.

The semiconductor device package and the method of manufacturing the semiconductor device package according to the embodiment can improve the process efficiency and propose a new package structure, thereby reducing manufacturing cost and improving manufacturing yield.

According to embodiments, the semiconductor device package is provided with a body having high reflectance, so that a reflector can be prevented from being discolored, thereby improving reliability of the semiconductor device package.

According to embodiments, the semiconductor device package and the method of manufacturing a semiconductor device can prevent a re-melting phenomenon from occurring in a bonding region of the semiconductor device package during a process of re-bonding the semiconductor device package to a substrate or the like.

DETAILED DESCRIPTION OF THE EMBODIMENTS

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer." In addition, "on/over" or "under" of each layer will be described based on the drawings, but the embodiments are not limited thereto.

Hereinafter, a semiconductor device package and a method of manufacturing the semiconductor device package according to the embodiment will be described in detail with reference to the accompanying drawings. Hereinafter, the description will be based on a situation where a light emitting device is applied as an example of the semiconductor device.

First, a light emitting device package according to an embodiment of the present invention will be described with reference to FIGS. 1 to 3.

Figure 1:
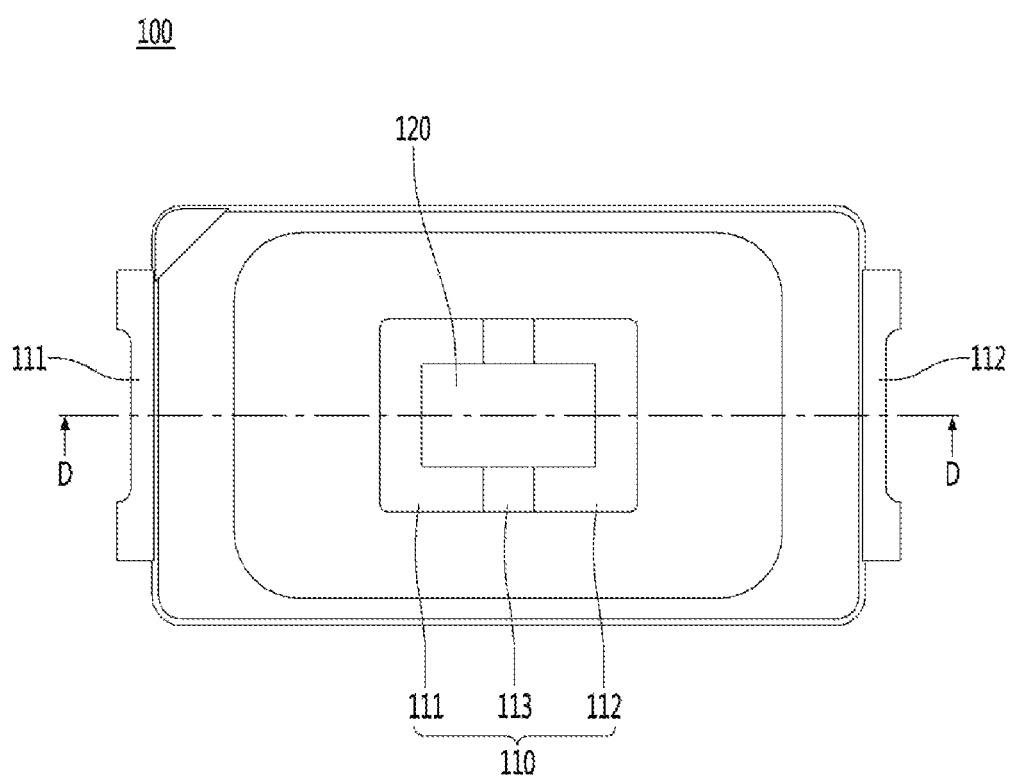
FIG. 1 is a plan view showing a light emitting device package according to an embodiment of the present invention.
Figure 2:
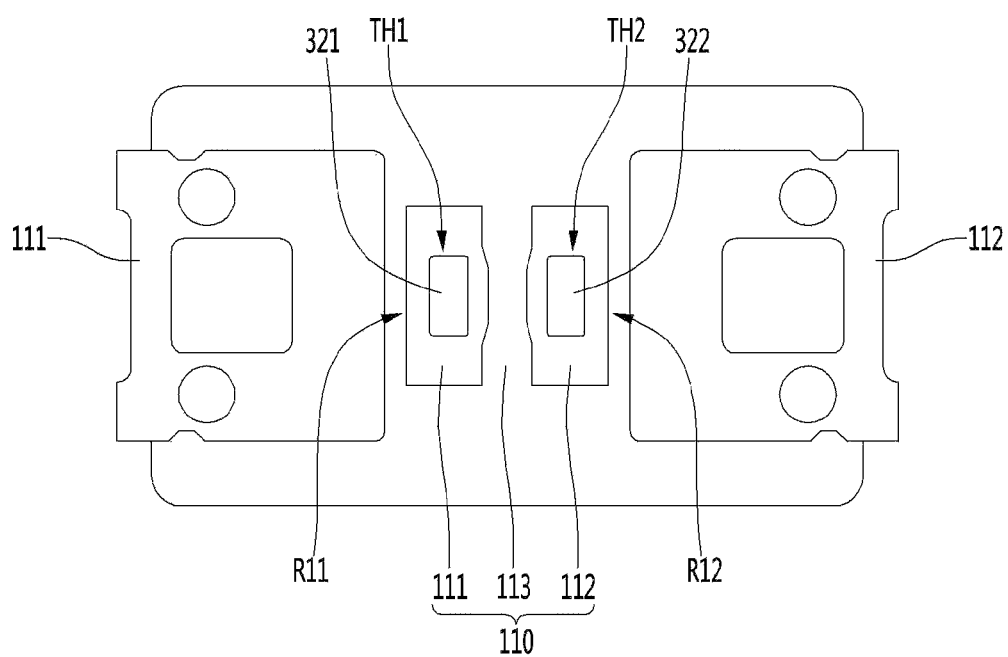
FIG. 2 is a bottom view showing a light emitting device package shown in FIG. 1.
Figure 3:
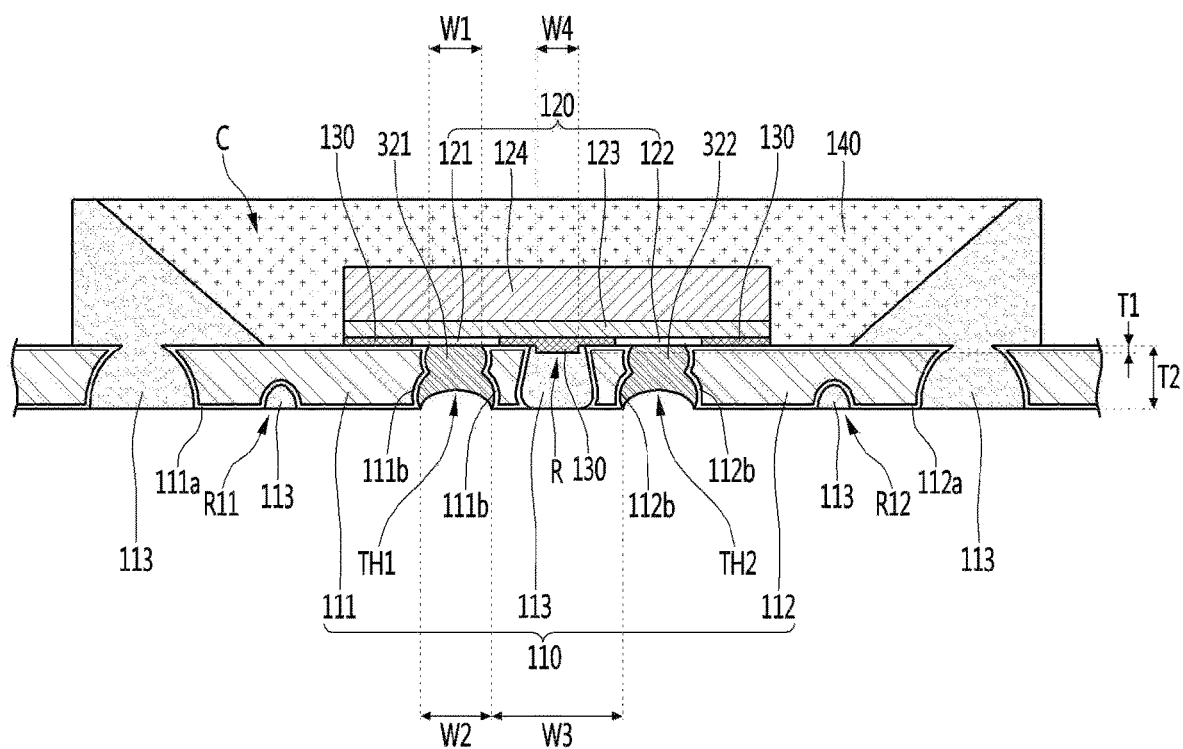
FIG. 3 is a sectional view taken along the line D-D of the light emitting device package shown in FIG. 1.

FIG. 1 is a plan view showing a light emitting device package according to an embodiment of the present invention, FIG. 2 is a bottom view showing the light emitting device package shown in FIG. 1, and FIG. 3 is a sectional view showing the light emitting device package taken along line D-D of FIG. 1.

According to an embodiment, as shown in FIGS. 1 to 3, a light emitting device package 100 may include a package body 110 and a light emitting device 120.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line. The body 113 may be also referred to as an insulating member.

The body 113 may be disposed on the first frame 111. In addition, the body 113 may be disposed on the second frame 112.

The body 113 may be provided with an inclined surface disposed on the first frame 111 and the second frame 112. Due to the inclined surface of the body 113, a cavity C may be provided over the first frame 111 and the second frame 112.

According to an embodiment, the package body 110 may have a structure provided with the cavity C, or may have a structure provided with a flat upper surface without the cavity C.

For example, the body 113 may be formed of a material selected from the group consisting of polyphthalamide (PPA), polychloro tri phenyl (PCT), liquid crystal polymer (LCP), polyamide9T (PA9T), silicone, an epoxy molding compound (EMC), a silicone molding compound (SMC), ceramic, a photo sensitive glass (PSG), a sapphire ($Al_2O_3$), and the like. In addition, the body 113 may include a high refractive filler such as $TiO_2$ and $SiO_2$.

The first frame 111 and the second frame 112 may be conductive frames. The first frame 111 and the second frame 112 may provide stable the structural strength to the package body 110, and may be electrically connected to the light emitting device 120.

According to the embodiment, the light emitting device 120 may include a first bonding part 121, a second bonding part 122, a light emitting structure 123, and a substrate 124.

The light emitting structure 123 may include a first conductive semiconductor layer, a second conductive semiconductor layer, and an active layer disposed between the first conductive semiconductor layer and the second conductive semiconductor layer. The first bonding part 121 may be electrically connected to the first conductive semiconductor layer. In addition, the second bonding part 122 may be electrically connected to the second conductive semiconductor layer.

The light emitting device 120 may be disposed over the package body 110. The light emitting device 120 may be disposed over the first frame 111 and the second frame 112. The light emitting device 120 may be disposed in the cavity C provided by the package body 110.

The first bonding part 121 may be disposed on a lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

The first bonding part 121 and the second bonding part 122 may be provided in a single layer or multiple layers using at least one material or an alloy selected from the group including Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

In addition, as shown in FIGS. 1 to 3, the light emitting device package 100 according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first bonding part 121 of the light emitting device 120. The first opening part TH1 may overlap with the first bonding part 121 of the light emitting device 120. The first opening part TH1 may overlap with the first bonding part 121 of the light emitting device 120 in the first direction, which is directed from the upper surface toward the lower surface of the first frame 111. The first bonding part 121 may be disposed on the first opening part TH1.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second bonding part 122 of the light emitting device 120. The second opening part TH2 may overlap with the second bonding part 122 of the light emitting device 120. The second opening part TH2 may overlap with the second bonding part 122 of the light emitting device 120 in the first direction, which is directed from the upper surface toward the lower surface of the second frame 112. The second bonding part 122 may be disposed on the second opening part TH2.

The first opening part TH1 and the second opening part TH2 may be spaced apart from each other. The first opening part TH1 and the second opening part TH2 may be spaced apart from each other under the lower surface of the light emitting device 120.

According to the embodiment, the width W1 of an upper region of the first opening part TH1 may be less than or equal to the width of the first bonding part 121. In addition, the width of an upper region of the second opening part TH2 may be less than or equal to the width of the second bonding part 122.

Therefore, the first bonding part 121 of the light emitting device 120 can be attached to the first frame 111 more firmly. In addition, the second bonding part 122 of the light emitting device 120 can be attached to the second frame 112 more firmly.

In addition, the width W1 of the upper region of the first opening part TH1 may be less than or equal to the width W2 of a lower region of the first opening part TH1. In addition, the width of the upper region of the second opening part TH2 may be less than or equal to the width of a lower region of the second opening part TH2.

A first opening TH1 may include an upper region arranged adjacent to an upper surface of a first frame 111 and a lower region arranged adjacent to a lower surface of the first frame 111. For example, a periphery of the upper region of the first opening TH1 may be smaller than a periphery of the lower region of the first opening TH1.

The first opening TH1 includes a first point having a smallest periphery in a first direction and the first point may be closer to the upper region of the first opening than the upper region of the first opening TH1 based on a direction perpendicular to the first direction.

In addition, the first opening TH2 may include an upper region arranged adjacent to an upper surface of a second frame 112 and a lower region arranged adjacent to a lower surface of the second frame 1121. For example, a periphery of the upper region of the second opening TH2 may be smaller than a periphery of the lower region of the second opening TH2.

The second opening TH2 includes a first point where the second opening has a smallest periphery in the first direction and the first point may be closer to the upper region of the second opening Th2 than the upper region of the second opening TH2 based on the direction perpendicular to the first direction.

FIG. 3 shows the situation that the light emitting device package is etched in the top and bottom directions of first and second lead frames 111 and 112, respectively, in the process of forming the first and second openings TH1 and TH2.

As etching processes are separately performed in the top and bottom directions of the first and second lead frames 111 and 112, the first and second openings TH1 and TH2 may be provided in a shape of a snowman (e.g., the appearance of at least to spherical shapes that are connected).

Each width of the first and second openings TH1 and TH2 may gradually increase and then decrease again from the lower region to a middle region thereof. In addition, the width may gradually increase and then decrease again to the upper region from the middle region where the width is decreased.

The aforementioned first point of the first and second openings TH1 and TH2 may denote a boundary region in which the size of the opening in the snowman shape decreases and then increases again from the lower region to the upper region.

The first and second openings TH1 and TH2 may include a first region arranged on each of the upper surface of the first and second frames 111 and 112 and a second region arranged on each of the lower surface of the first and second frames 111 and 112. The width of the upper surface of the first region may be smaller than the width of the lower surface of the second region.

In addition, the first and second frames 111 and 112 may include a support member and first and second metal layers 111a and 112a surrounding the support member.

According to the embodiment, after the etching process of forming the first and second openings TH1 and TH2 is completed, the first and second metal layers 111a and 112a may be provided by a plating process and so on with respect to the support member constituting the first and second frame 111 and 112. Accordingly, the first and second metal layers 111a and 112a may be provided on surfaces of the support members constituting the first and second frames 111 and 112, respectively.

The first and second metal layers 111a and 112a may be provided on upper and lower surfaces of the first and second frames 111 and 112, respectively. In addition, the first and second metal layers 111a and 112a may be provided in a boundary region making contact with the first and second openings TH1 and TH2, respectively.

In addition, the first and second metal layers 111a and 112a provided in the boundary region making contact with the first and second openings TH1 and TH2 may be combined with the first and second conductive layers 321 and 322 provided in the first and second openings TH1 and TH2, thereby forming first and second alloy layers 111b and 112b, respectively. The formation of the first and second alloy layers 111b and 112b will be described later.

For example, the first and second frames 111 and 112 may be provided with a Cu layer as a basic support member. In addition, the first and second metal layers 111a and 112a may include at least one of a Ni layer, an Ag layer, and the like.

In the situation that the first and second metal layers 111a and 112a include a Ni layer, because the Ni layer has a small change with respect to thermal expansion, the position of the light emitting device disposed on the upper side may be stably fixed by the Ni layer even when the size or arranged position of the package body is changed due to the thermal expansion. In the situation that the first and second metal layers 111a and 112a include an Ag layer, the Ag layer may efficiently reflect light emitted from the light emitting device disposed on the upper side thereof and improve light intensity.

According to the embodiment, when the first and second bonding parts 121 and 122 of the light emitting device 120 are arranged to have a small size to improve the light extraction efficiency, the width of the upper region of the first opening TH1 may be greater than or equal to the width of the first bonding part 121. In addition, the width of the upper region of the second opening TH2 may be greater than or equal to the width of the second bonding part 122.

In addition, the width of the upper region of the first opening part TH1 may be less than or equal to the width of a lower region of the first opening part TH1. In addition, the width of the upper region of the second opening part TH2 may be less than or equal to the width of a lower region of the second opening part TH2.

For example, the width of the upper region of the first opening TH1 may be in the range of tens of micrometers to hundreds of micrometers. In addition, the width of the lower region of the first opening TH1 may be tens of micrometers to hundreds of micrometers greater than the width of the upper region of the first opening TH1.

In addition, the width of the upper region of the second opening TH2 may be in the range of tens of micrometers to hundreds of micrometers. In addition, the width of the lower region of the second opening TH2 may be tens of micrometers to hundreds of micrometers greater than the width of the upper region of the second opening TH2.

A width W3 between the first opening part TH1 and the second opening part TH2 in a lower surface region of the first frame 111 and the second frame 112 may be several hundreds of micrometers. The width W3 between the first opening part TH1 and the second opening part TH2 in the lower surface region of the first frame 111 and the second frame 112 may be, for example, 100 micrometers to 150 micrometers.

When the light emitting device package 100 is mounted on a circuit board later, a sub-mount or the like, the width W3 between the first opening part TH1 and the second opening part TH2 in the lower surface region of the first frame 111 and the second frame 112 may be selected to be a predetermined distance or more to prevent an electrical short between pads.

According to an embodiment, the light emitting device package 100 may include a first resin 130.

The first resin 130 may be disposed between the body 113 and the light emitting device 120. The first resin 130 may be disposed between an upper surface of the body 113 and a lower surface of the light emitting device 120.

In addition, according to an embodiment, as shown in FIGS. 1 to 3, the light emitting device package 100 may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may make contact with a side surface of the first bonding part 121 and a side surface of the second bonding part 122.

The first resin 130 may include an adhesive function. The first resin 130 may provide adhesive strength to neighboring components. The first resin 130 may be referred to as an adhesive.

The first resin 130 may provide stable fixing strength between the light emitting device 120 and the package body 110. The first resin 130 may provide the stable fixing strength between the light emitting device 120 and the body 113. The first resin 130 may make, for example, direct contact with the upper surface of the body 113. In addition, the first resin 130 may make direct contact with the lower surface of the light emitting device 120.

For example, the first resin 130 may include at least one of an epoxy-based material, a silicone-based material, a hybrid material including the epoxy-based material and the silicone-based material. In addition, for example, if the first resin 130 includes a reflection function, the adhesive may include white silicone.

The first resin 130 may provide the stable fixing strength between the body 113 and the light emitting device 120, and if light is emitted through the lower surface of the light emitting device 120, the first resin 130 may provide a light diffusion function between the light emitting device 120 and the body 113. When the light is emitted from the light emitting device 120 through the lower surface of the light emitting device 120, the first resin 130 may improve light extraction efficiency of the light emitting device package 100 by the light diffusion function. In addition, the first resin 130 may reflect the light emitted from the light emitting device 120. In the situation of the first resin 130 including a reflection function, the first resin 130 may be formed of a material including $TiO_2$, $SiO_2$ or the like.

According to an embodiment, a depth T1 of the recess R may be smaller than a depth T2 of the first opening part TH1 or a depth T2 of the second opening part TH2.

The depth T1 of the recess R may be determined in consideration of adhesive strength of the first resin 130. The depth T1 of the recess R may be determined in consideration of stable strength of the body 113 and/or determined to prevent a crack from being generated on the light emitting device package 100 due to heat emitted from the light emitting device 120.

The recess R may provide a space suitable for performing a sort of an under fill process at a lower portion of the light emitting device 120. The under fill process may be a process of disposing the first resin 130 at the lower portion of the light emitting device 120 after mounting the light emitting device 120 on the package body 110, or a process of disposing the light emitting device 120 after disposing the first resin 130 in the recess R to mount the light emitting device 120 on the package body 110 through the first resin 130 during a process of mounting the light emitting device 120 on the package body 110.

The recess R may have a first depth or more to sufficiently provide the first resin 130 between the lower surface of the light emitting device 120 and the upper surface of the body 113. In addition, the recess R may have a second depth or less to provide the stable strength to the body 113.

The depth T1 and a width W4 of the recess R may influence a position and fixing strength of the first resin 130. The depth T1 and the width W4 of the recess R may be determined such that sufficient fixing strength is provided by the first resin 130 disposed between the body 113 and the light emitting device 120.

For example, the depth T1 of the recess R may be several tens of micrometers. The depth T1 of the recess R may be 40 micrometers to 60 micrometers.

In addition, the width W4 of the recess R may be several tens of micrometers to several hundreds of micrometers. In this situation, the width W4 of the recess R may be defined in a long axis direction of the light emitting device 120.

The width W4 of the recess R may be narrower than a distance between the first bonding part 121 and the second bonding part 122. The width W4 of the recess R may be 140 micrometers to 160 micrometers. For example, the width W4 of the recess R may be 150 micrometers.

The depth T2 of the first opening part TH1 may be determined corresponding to a thickness of the first frame 111. The depth T2 of the first opening part TH1 may be determined such that the first frame 111 may maintain stable strength.

The depth T2 of the second opening part TH2 may be determined corresponding to a thickness of the second frame 112. The depth T2 of the second opening part TH2 may be determined such that the second frame 112 may maintain stable strength.

The depth T2 of the first opening part TH1 and the depth T2 of the second opening part TH2 may be determined corresponding to a thickness of the body 113. The depth T2 of the first opening part TH1 and the depth T2 of the second opening part TH2 may be determined such that the body 113 may maintain the stable strength.

For example, the depth T2 of the first opening part TH1 may be hundreds of micrometers. The depth T2 of the first opening part TH1 may be provided in the range of 180 micrometers to 220 micrometers. For example, the depth T2 of the first opening part TH1 may be 200 micrometers.

For example, the T2-T1 thickness may be selected to be at least 100 micrometers. This is based on the thickness of the injection process that may provide crack free in the body 113.

According to the embodiment, the ratio of T2/T1 may be provided in the range of 2 to 10. For example, when the thickness of T2 is provided as 200 micrometers, the thickness of T1 may be provided in the range of 20 micrometers to 100 micrometers.

In addition, as shown in FIGS. 1 to 3, the light emitting device package 100 according to the embodiment may include a molding part 140.

The molding part 140 may be provided on the light emitting device 120. The molding part 140 may be disposed on the first frame 111 and the second frame 112. The molding part 140 may be disposed in the cavity C provided by the package body 110.

The molding part 140 may include an insulating material. In addition, the molding part 140 may include a wavelength conversion unit for receiving light emitted from the light emitting device 120 to provide wavelength-converted light. For example, the molding part 140 may include at least one selected from the group consisting of a fluorescent substance, a quantum dot, and the like.

In addition, according to an embodiment, as shown in FIGS. 1 to 3, the light emitting device package 100 may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first bonding part 121. A width of the first conductive layer 321 may be smaller than a width of the first bonding part 121.

The first bonding part 121 may have a width defined in a second direction perpendicular to the first direction along which the first opening part TH1 is provided. The width of the first bonding part 121 may be larger than the width of the first opening part TH1 in the second direction.

The first conductive layer 321 may make direct contact with a lower surface of the first bonding part 121. The first conductive layer 321 may be electrically connected to the first bonding part 121. The first conductive layer 321 may be surrounded by the first frame 111. The first conductive layer 321 may include a lower surface concavely provided in a direction from a lower portion to an upper portion thereof.

The second conductive layer 322 may be provided in the second opening part TH2. The second conductive layer 322 may be disposed under the second bonding part 122. A width of the second conductive layer 322 may be smaller than a width of the second bonding part 122.

The second bonding part 122 may have a width defined in the second direction perpendicular to the first direction along which the second opening part TH2 is provided. The width of the second bonding part 122 may be larger than the width of the second opening part TH2 in the second direction.

The second conductive layer 322 may make direct contact with a lower surface of the second bonding part 122. The second conductive layer 322 may be electrically connected to the second bonding part 122. The second conductive layer 322 may be surrounded by the second frame 112. The second conductive layer 322 may include a lower surface concavely provided in a direction from a lower portion to an upper portion thereof.

The first conductive layer 321 and the second conductive layer 322 may include one material selected from the group consisting of Ag, Au, Pt, Sn, Cu and the like, or an alloy thereof. However, embodiments are not limited thereto, and the first conductive layer 321 and the second conductive layer 322 may be formed of a material capable of ensuring a conduction function.

For example, the first conductive layer 321 and the second conductive layer 322 may be formed of a conductive paste. The conductive paste may include a solder paste, a silver paste or the like, and may be composed of a multilayer formed of mutually different materials, or a multilayer or a single layer formed of an alloy. For example, the first conductive layer 321 and the second conductive layer 322 may include SAC(Sn—Ag—Cu).

According to the embodiment, in the process of forming the first and second conductive layers 321 and 322 or in the heat treatment process after providing the first and second conductive layers 321 and 322, an intermetallic compound (IMC) layer may be provided between the first and second conductive layers 321 and 322 and the first and second frames 111 and 112.

For example, first and second alloy layers 111b and 112b may be formed by the combination between materials of the first and second conductive layers 321 and 322 and the first and second metal layers 111a and 112a of the first and second frames 111 and 112, respectively.

Accordingly, the first conductive layer 321 and the first frame 111 may be stably coupled to each other physically and electrically. The first conductive layer 321, the first alloy layer 111b, and the first frame 111 may be stably coupled to each other physically and electrically.

In addition, the second conductive layer 322 and the second frame 112 may be stably coupled to each other physically and electrically. The second conductive layer 322, the second alloy layer 112b, and the second frame 112 may be stably coupled to each other physically and electrically.

For example, the first and second alloy layers 111b and 112b may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second metal layer 111a and 112a or the support members of the first and second frames 111 and 112.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second metal layers 111a and 112a include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include the Sn material and the first and second metal layers 111a and 112a include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include the Sn material and the support member of the first and second frames 111 and 112 include a Cu material, an intermetallic compound layer of CuSn may be formed by the combination of the Sn material and the Cu material in the process of providing the first and second conductive layers 321 and 322, or in the heat treatment process thereafter.

In addition, when the first and second conductive layers 321 and 322 include the Ag material and the support member of the first and second frames 111 and 112 include the Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, according to the embodiment, the intermetallic compound layer may also be provided between the first and second bonding parts 121 and 122 and the first and second conductive layers 321 and 322.

As similar to the above description, according to the embodiment, in the process of forming the first and second conductive layers 321 and 322 or in the heat treatment process after providing the first and second conductive layers 321 and 322, the intermetallic compound (IMC) layer may be provided between the first and second conductive layers 321 and 322 and the first and second bonding parts 121 and 122.

For example, an alloy layer may be formed by the combination between materials constituting the first and second conductive layers 321 and 322 and the first and second bonding parts 121 and 122.

Accordingly, the first conductive layer 321 and the first bonding part 121 may be stably coupled to each other physically and electrically. The first conductive layer 321, the alloy layer, and the first bonding part 121 may be stably coupled to each other physically and electrically.

In addition, the second conductive layer 322 and the second bonding part 122 may be stably coupled to each other physically and electrically. The second conductive layer 322, the alloy layer, and the second bonding part 122 may be stably coupled to each other physically and electrically.

For example, the alloy layer may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second bonding parts 121 and 122.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second bonding parts 121 and 122 include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include an Sn material and the first and second bonding parts 121 and 122 include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include an Ag material and the first and second bonding parts 121 and 122 include an Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, according to an embodiment, as shown in FIGS. 1 to 3, the light emitting device package 100 may include a first lower recess R11 and a second lower recess R12. The first lower recess R11 and the second lower recess R12 may be spaced apart from each other.

The first lower recess R11 may be provided in a lower surface of the first frame 111. The first lower recess R11 may be concavely provided from the lower surface toward an upper surface of the first frame 111. The first lower recess R11 may be spaced apart from the first opening part TH1.

The first lower recess R11 may have a width of several micrometers to several tens of micrometers. A resin part may be provided in the first lower recess R11. The resin part filled in the first lower recess R11 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the first lower recess R11 may be provided in a process of forming the first frame 111, the second frame 112, and the body 113 through an injection molding process or the like.

The resin part filled in the first lower recess R11 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as shown in FIG. 2, the lower surface region of the first frame 111 provided with the first opening part TH1 may be isolated from the first frame 111 around the lower surface region by the resin part filled in the first lower recess R11 and the body 113.

Therefore, if the resin part is formed of a material representing low adhesive strength and low wettability with the first and second conductive layers 321 and 322, or a material representing low surface tension between the resin part and the first and second conductive layers 321 and 322, the first conductive layer 321 provided in the first opening part TH1 can be prevented from being diffused over the resin part filled in the first lower recess R11 or the body 113 by overflowing from the first opening part TH1.

This is based on adhesion relation between the first conductive layer 321 and the resin part and between the first conductive layer 321 and the body 113, or the low wettability and low surface tension between the resin part and the first and second conductive layers 321 and 322. In other words, a material constituting the first conductive layer 321 may be selected to represent good adhesion with the first frame 111. In addition, the material constituting the first conductive layer 321 may be selected to represent low adhesion with the resin part and the body 113.

Accordingly, the first conductive layer 321 is prevented from flowing out or spreading to an outside of the region where the resin part or the body 113 is provided by flowing out from the first opening part TH1 toward a region where the resin part or the body 113 is provided, and the first conductive layer 321 can be stably disposed in a region where the first opening part TH1 is provided.

Therefore, if the first conductive layer 321 disposed in the first opening part TH1 flows out, the first conductive layer 321 can be prevented from expanding to an external region of the resin part or the first lower recess R11 provided with the body 113. In addition, the first conductive layer 321 can be stably connected to the lower surface of the first bonding part 121 in the first opening part TH1.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in a process of disposing the first and second conductive layers 321 and 322.

In addition, the second lower recess R12 may be provided in a lower surface of the second frame 112. The second lower recess R12 may be concavely provided from the lower surface toward an upper surface of the second frame 112. The second lower recess R12 may be spaced apart from the second opening part TH2.

The second lower recess R12 may have a width of several micrometers to several tens of micrometers. The resin part may be provided in the second lower recess R12. The resin part filled in the second lower recess R12 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the second lower recess R12 may be provided in the process of forming the first frame 111, the second frame 112, and the body 113 through an injection molding process or the like.

The resin part filled in the second lower recess R12 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as shown in FIG. 2, the lower surface region of the second frame 112 provided with the second opening part TH2 may be isolated from the second frame 112 around the lower surface region by the resin part filled in the second lower recess R12 and the body 113.

Therefore, if the resin part is formed of a material representing low adhesive strength and low wettability with the first and second conductive layers 321 and 322, or a material representing low surface tension between the resin part and the first and second conductive layers 321 and 322, the second conductive layer 322 provided in the second opening part TH2 can be prevented from being diffused over the resin part filled in the second lower recess R12 or the body 113 by overflowing from the second opening part TH2.

This is based on adhesion relation between the second conductive layer 322 and the resin part and between the second conductive layer 322 and the body 113, or the low wettability and low surface tension between the resin part and the first and second conductive layers 321 and 322. In other words, a material constituting the second conductive layer 322 may be selected to represent good adhesion with the second frame 112. In addition, the material constituting the second conductive layer 322 may be selected to represent low adhesion with the resin part and the body 113.

Accordingly, the second conductive layer 322 is prevented from flowing out or spreading to an outside of the region where the resin part or the body 113 is provided by flowing out from the second opening part TH2 toward a region where the resin part or the body 113 is provided, and the second conductive layer 322 can be stably disposed in a region where the second opening part TH2 is provided.

Therefore, if the second conductive layer 322 disposed in the second opening part TH2 flows out, the second conductive layer 322 can be prevented from expanding to an external region of the resin part or the second lower recess R12 provided with the body 113. In addition, the second conductive layer 322 can be stably connected to the lower surface of the second bonding part 122 in the second opening part TH2.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in the process of disposing the first and second conductive layers 321 and 322.

In addition, according to the light emitting device package 100 of the embodiment, as shown in FIG. 3, the first resin 130 provided in the recess R may be provided between the lower surface of the light emitting device 120 and the upper surface of the package body 110. When viewed from the top of the light emitting device 120, the first resin 130 may be provided around the first and second bonding parts 121 and 122. In addition, when viewed from the top of the light emitting device 120, the first resin 130 may be provided around the first and second openings TH1 and TH2.

The first resin 130 may function to stably fix the light emitting device 120 to the package body 110. In addition, the first resin 130 may be disposed around the first and second bonding parts 121 and 122 and in contact with side surfaces of the first and second bonding parts 121 and 122.

The first resin 130 may seal peripheries of the first bonding part 121 and the second bonding part 122. The resin 130 may prevent the first conductive layer 321 and the second conductive layer 322 from being diffused and moved by overflowing from regions of the first opening TH1 and the second opening TH2 outward of the light emitting device 120. When the first and second conductive layers 321 and 322 are diffused and moved outward of the light emitting device 120, a failure due to a short may be caused since the first and second conductive layers 321 and 322 may make contact with the active layer of the light emitting device 120. Accordingly, when the first resin 130 is disposed, the short caused by the first and second conductive layers 321 and 322 and the active layer may be prevented, thereby improving the reliability of the light emitting device package according to the embodiment.

In addition, the resin 130 may prevent the first conductive layer 321 and the second conductive layer 322 from being diffused and moved by overflowing from regions of the first opening TH1 and the second opening TH2 under the lower surface of the light emitting device 120 in the direction of the recess. Accordingly, the first conductive layer 321 and the second conductive layer 322 may be prevented from being electrically short-circuited under the light emitting device 120.

In addition, according to the embodiment, the light emitting structure 123 may be provided as a compound semiconductor. The light emitting structure 123 may be provided as, for example, a group II-VI or group III-V compound semiconductor. For example, the light emitting structure 123 may include at least two elements selected from aluminum (Al), gallium (Ga), indium (In), phosphorus (P), arsenic (As), and nitrogen (N).

The light emitting structure 123 may include the first conductive semiconductor layer, the active layer, and the second conductive semiconductor layer.

The first and second conductive semiconductor layers may be implemented using at least one of group III-V or group II-VI compound semiconductors. The first and second conductive semiconductor layers may be formed of a semiconductor material having a composition formula such as $In_xAl_yGa_{1-x-y}N$ ($0 \leq x \leq 1$, $0 \leq y \leq 1$, $0 \leq x+y \leq 1$). For example, the first and second conductive semiconductor layers may include at least one selected from the group including GaN, AlN, AlGaN, InGaN, InN, InAlGaN, AlInN, AlGaAs, GaP, GaAs, GaAsP, and AlGaInP. The first conductive semiconductor layer may be an n-type semiconductor layer doped with an n-type dopant such as Si, Ge, Sn, Se, and Te. The second conductive semiconductor layer may be a p-type semiconductor layer doped with a p-type dopant such as Mg, Zn, Ca, Sr, and Ba.

The active layer may be implemented by the compound semiconductor. The active layer may be implemented using at least one of group III-V or group II-VI compound semiconductors. When the active layer is implemented as a multi-well structure, the active layer may include well layers and barrier layers which are alternately arranged, and may be arranged using the semiconductor material having the composition formula such as $In_xAl_yGa_{1-x-y}N$ ($0 \leq x \leq 1$, $0 \leq y \leq 1$, $0 \leq x+y \leq 1$). For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

In the light emitting device package 100 according to an embodiment, a power source may be connected to the first bonding part 121 through a region of the first opening part TH1, and the power source may be connected to the second bonding part 122 through a region of the second opening part TH2.

Accordingly, the light emitting device 120 can be driven by a driving power supplied through the first bonding part 121 and the second bonding part 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a bonding part of the light emitting device may receive a driving power through a conductive layer disposed in an opening part. In addition, a melting point of the conductive layer disposed in the opening part may be selected to be a value higher than a melting point of a typical bonding material and a melting point of an IMC layer.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Hereinafter, a method of manufacturing a light emitting device package according to an embodiment of the present invention will be described with reference to FIGS. 4 to 7.

While describing the method of manufacturing the light emitting device package according to an embodiment of the present invention with reference to FIGS. 4 to 7, the descriptions that overlap with those described with reference to FIGS. 1 to 3 may be omitted.

Figure 4:
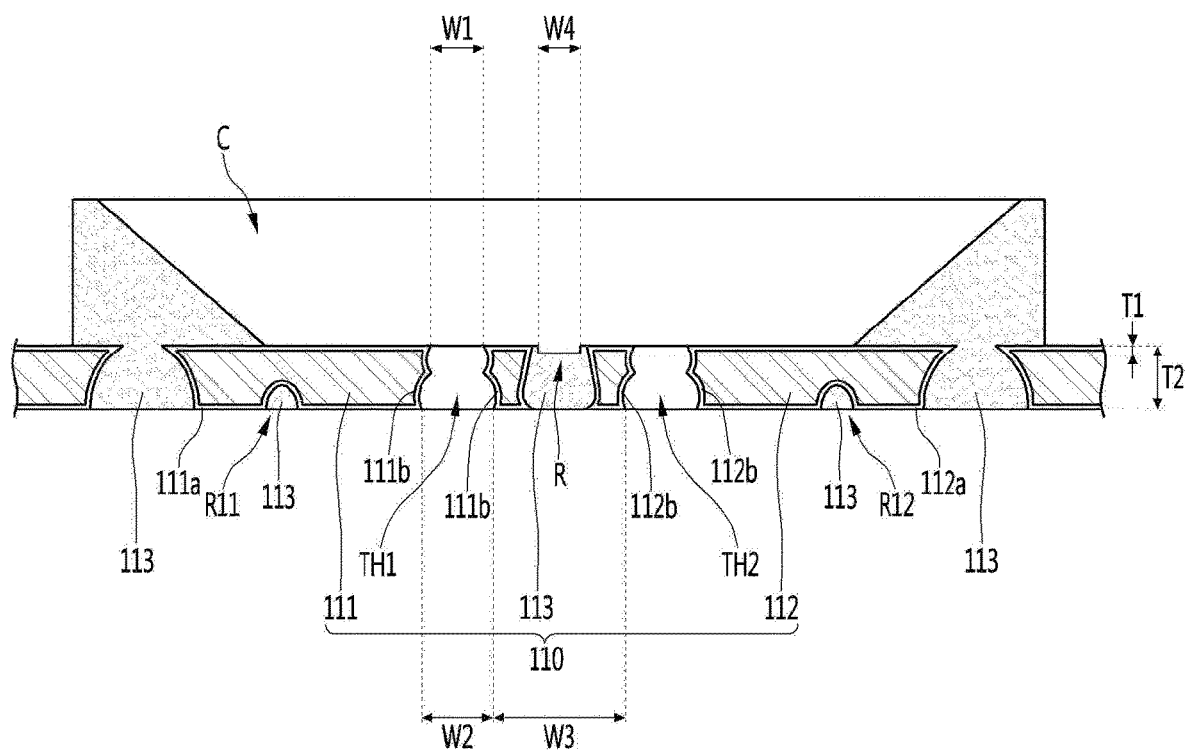
FIGS. 4 to 7 are views describing a method of manufacturing a light emitting device package according to an embodiment of the present invention.

First, in the method of manufacturing the light emitting device package according to an embodiment of the present invention, as shown in FIG. 4, the package body 110 may be provided.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112.

The body 113 may be disposed on the first frame 111. In addition, the body 113 may be disposed on the second frame 112.

The body 113 may be provided with an inclined surface disposed on the first frame 111 and the second frame 112. Due to the inclined surface of the body 113, a cavity C may be provided over the first frame 111 and the second frame 112.

In addition, the first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The second opening part TH2 may be provided in the second frame 112. The second opening part TH2 may be provided through the second frame 112. The second opening part TH2 may be provided through an upper surface and a lower surface of the second frame 112 in the first direction.

The package body 110 may include a recess R provided in the body 113.

The recess R may be provided in the body 113. The recess R may be provided between the first opening part TH1 and the second opening part TH2. The recess R may be concavely provided from an upper surface toward a lower surface of the body 113.

A first opening TH1 may include an upper region arranged adjacent to an upper surface of a first frame 111 and a lower region arranged adjacent to a lower surface of the first frame 111. For example, a periphery of the upper region of the first opening TH1 may be smaller than a periphery of the lower region of the first opening TH1.

The first opening TH1 includes a first point having a smallest periphery in a first direction and the first point may be closer to the upper region of the first opening than the upper region of the first opening TH1 based on a direction perpendicular to the first direction.

In addition, the first opening TH2 may include an upper region arranged adjacent to an upper surface of a second frame 112 and a lower region arranged adjacent to a lower surface of the second frame 1121. For example, a periphery of the upper region of the second opening TH2 may be smaller than a periphery of the lower region of the second opening TH2.

The second opening TH2 includes a first point where the second opening has a smallest periphery in the first direction and the first point may be closer to the upper region of the second opening Th2 than the upper region of the second opening TH2 based on the direction perpendicular to the first direction.

In addition, according to an embodiment, as shown in FIG. 4, the light emitting device package 100 may include a first lower recess R11 and a second lower recess R12. The first lower recess R11 and the second lower recess R12 may be spaced apart from each other.

The first lower recess R11 may be provided in a lower surface of the first frame 111. The first lower recess R11 may be concavely provided from the lower surface toward an upper surface of the first frame 111. The first lower recess R11 may be spaced apart from the first opening part TH1.

The first lower recess R11 may have a width of several micrometers to several tens of micrometers. A resin part may be provided in the first lower recess R11. The resin part filled in the first lower recess R11 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the first lower recess R11 may be provided in a process of forming the first frame 111, the second frame 112, and the body 113 through an injection molding process or the like.

The resin part filled in the first lower recess R11 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

In addition, the second lower recess R12 may be provided in a lower surface of the second frame 112. The second lower recess R12 may be concavely provided from the lower surface toward an upper surface of the second frame 112. The second lower recess R12 may be spaced apart from the second opening part TH2.

The second lower recess R12 may have a width of several micrometers to several tens of micrometers. The resin part may be provided in the second lower recess R12. The resin part filled in the second lower recess R12 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the second lower recess R12 may be provided in the process of forming the first frame 111, the second frame 112, and the body 113 through an injection molding process or the like.

The resin part filled in the second lower recess R12 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

Figure 5:
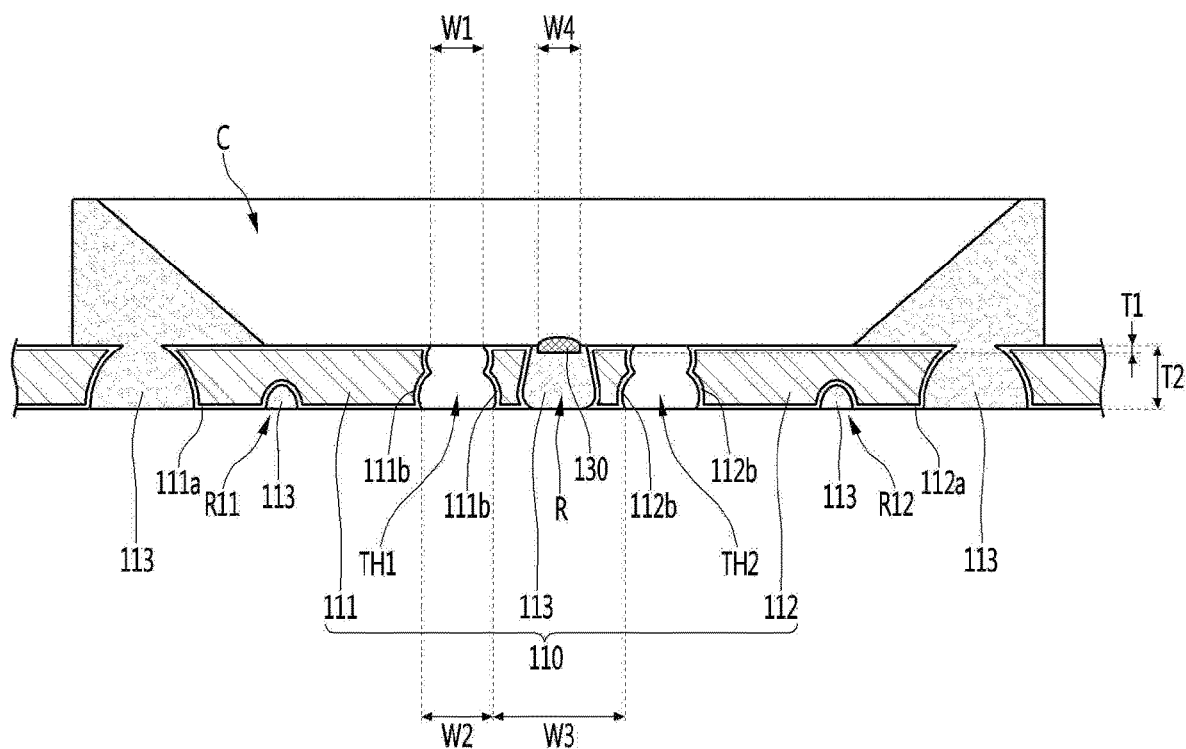

Next, in the method of manufacturing the light emitting device package according to an embodiment, as shown in FIG. 5, the first resin 130 may be provided in the recess R.

The first resin 130 may be provided in a region of the recess R through a dotting scheme or the like. For example, the first resin 130 may be provided in a region where the recess R is provided, and may be provided to the extent that the first resin 130 overflows from the recess R.

Figure 6:
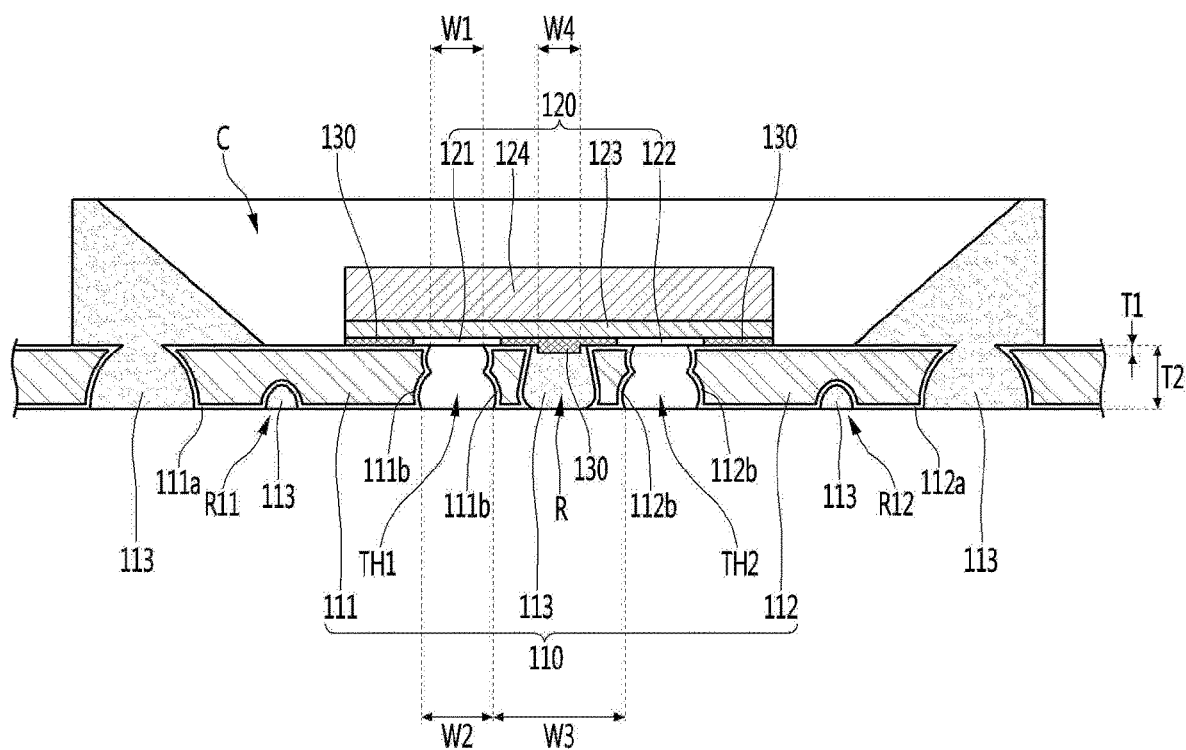

In addition, in the method of manufacturing the light emitting device package according to an embodiment, as shown in FIG. 6, the light emitting device 120 may be provided on the package body 110.

According to an embodiment, the recess R may serve as a sort of an align key in a process of disposing the light emitting device 120 on the package body 110.

The light emitting device 120 may be fixed to the body 113 by the first resin 130. A part of the first resin 130 provided in the recess R may be moved toward the first bonding part 121 and the second bonding part 122 of the light emitting device 120 and cured. The first resin 130 may seal surroundings of the first and second bonding parts 121 and 122.

Accordingly, the first resin 130 may be provided in a wide region between the lower surface of the light emitting device 120 and the upper surface of the body 113, and the fixing strength between the light emitting device 120 and the body 113 can be improved.

According to an embodiment, as described with reference to FIG. 3, the first opening part TH1 may be arranged under the first bonding part 121 of the light emitting device 120. The first opening part TH1 may overlap with the first bonding part 121 of the light emitting device 120. The first opening part TH1 may overlap with the first bonding part 121 of the light emitting device 120 in the first direction, which is directed from the upper surface toward the lower surface of the first frame 111.

The second opening part TH2 may be arranged under the second bonding part 122 of the light emitting device 120. The second opening part TH2 may overlap with the second bonding part 122 of the light emitting device 120. The second opening part TH2 may overlap with the second bonding part 122 of the light emitting device 120 in the first direction, which is directed from the upper surface toward the lower surface of the second frame 112.

Figure 7:
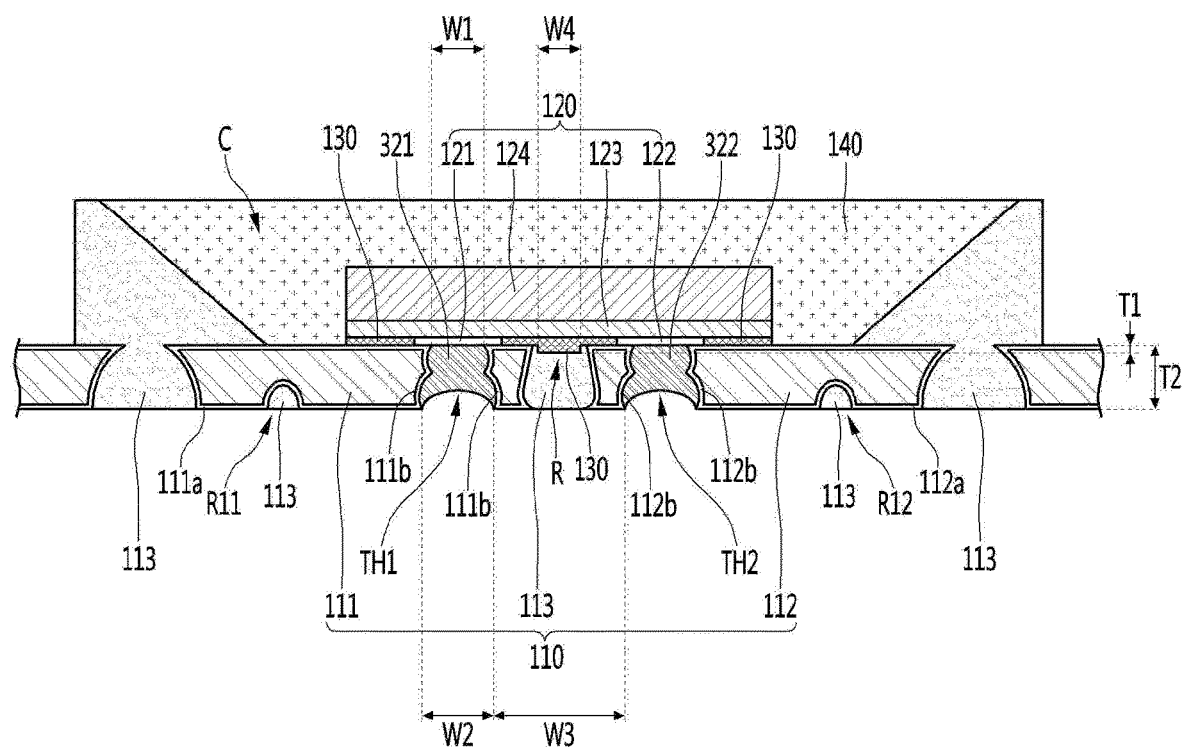

Next, in the method of manufacturing the light emitting device package according to an embodiment, as shown in FIG. 7, the first conductive layer 321, the second conductive layer 322, and the molding part 140 may be provided.

In the light emitting device package 100 according to the embodiment, the lower surface of the first bonding part 121 may be exposed through the first opening TH1. In addition, the lower surface of the second bonding part 122 may be exposed through the second opening TH2.

According to the embodiment, the first conductive layer 321 may be provided on the first opening TH1. In addition, the second conductive layer 322 may be provided on the second opening TH2.

The first conductive layer 321 may be provided in the first opening part TH1. The first conductive layer 321 may be disposed under the first bonding part 121. A width of the first conductive layer 321 may be smaller than a width of the first bonding part 121. The first conductive layer 321 may make direct contact with a lower surface of the first bonding part 121. The first conductive layer 321 may be electrically connected to the first bonding part 121. The first conductive layer 321 may be surrounded by the first frame 111.

The second conductive layer 322 may be provided in the second opening part TH2. The second conductive layer 322 may be disposed under the second bonding part 122. A width of the second conductive layer 322 may be smaller than a width of the second bonding part 122. The second conductive layer 322 may make direct contact with a lower surface of the second bonding part 122. The second conductive layer 322 may be electrically connected to the second bonding part 122. The second conductive layer 322 may be surrounded by the second frame 112.

For example, the first conductive layer 321 and the second conductive layer 322 may be formed of a conductive paste. The conductive paste may include a solder paste, a silver paste or the like, and may be composed of a multilayer formed of mutually different materials, or a multilayer or a single layer formed of an alloy. For example, the first conductive layer 321 and the second conductive layer 322 may include SAC(Sn—Ag—Cu).

According to the embodiment, in the process of forming the first and second conductive layers 321 and 322 or in the heat treatment process after providing the first and second conductive layers 321 and 322, an intermetallic compound (IMC) layer may be provided between the first and second conductive layers 321 and 322 and the first and second frames 111 and 112.

For example, first and second alloy layers 111b and 112b may be formed by the combination between materials of the first and second conductive layers 321 and 322 and the first and second metal layers 111a and 112a of the first and second frames 111 and 112, respectively.

Accordingly, the first conductive layer 321 and the first frame 111 may be stably coupled to each other physically and electrically. The first conductive layer 321, the first alloy layer 111b, and the first frame 111 may be stably coupled to each other physically and electrically.

In addition, the second conductive layer 322 and the second frame 112 may be stably coupled to each other physically and electrically. The second conductive layer 322, the second alloy layer 112b, and the second frame 112 may be stably coupled to each other physically and electrically.

For example, the first and second alloy layers 111b and 112b may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second metal layer 111a and 112a or the support members of the first and second frames 111 and 112.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second metal layers 111a and 112a include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include the Sn material and the first and second metal layers 111a and 112a include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include the Sn material and the support member of the first and second frames 111 and 112 include a Cu material, an intermetallic compound layer of CuSn may be formed by the combination of the Sn material and the Cu material in the process of providing the first and second conductive layers 321 and 322, or in the heat treatment process thereafter.

In addition, when the first and second conductive layers 321 and 322 include the Ag material and the support member of the first and second frames 111 and 112 include the Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, according to the embodiment, the intermetallic compound layer may also be provided between the first and second bonding parts 121 and 122 and the first and second conductive layers 321 and 322.

As similar to the above description, according to the embodiment, in the process of forming the first and second conductive layers 321 and 322 or in the heat treatment process after providing the first and second conductive layers 321 and 322, the intermetallic compound (IMC) layer may be provided between the first and second conductive layers 321 and 322 and the first and second bonding parts 121 and 122.

For example, an alloy layer may be formed by the combination between materials constituting the first and second conductive layers 321 and 322 and the first and second bonding parts 121 and 122.

Accordingly, the first conductive layer 321 and the first bonding part 121 may be stably coupled to each other physically and electrically. The first conductive layer 321, the alloy layer, and the first bonding part 121 may be stably coupled to each other physically and electrically.

In addition, the second conductive layer 322 and the second bonding part 122 may be stably coupled to each other physically and electrically. The second conductive layer 322, the alloy layer, and the second bonding part 122 may be stably coupled to each other physically and electrically.

For example, the alloy layer may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second bonding parts 121 and 122.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second bonding parts 121 and 122 include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include an Sn material and the first and second bonding parts 121 and 122 include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include an Ag material and the first and second bonding parts 121 and 122 include an Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

The molding part 140 may be provided on the light emitting device 120. The molding part 140 may be disposed on the first frame 111 and the second frame 112. The molding part 140 may be disposed in the cavity C provided by the package body 110.

The molding part 140 may include an insulating material. In addition, the molding part 140 may include a wavelength conversion unit for receiving light emitted from the light emitting device 120 to provide wavelength-converted light. For example, the molding part 140 may include at least one selected from the group consisting of a fluorescent substance, a quantum dot, and the like.

In addition, according to the embodiment, the molding part 140 may be provided after the first and second conductive layers 321 and 322 are provided. In addition, according to another embodiment of the method of manufacturing the light emitting device package according to the embodiment, the molding part 140 may be provided first, and the first conductive layer 321 and the second conductive layer 322 may be provided later.

In the light emitting device package 100 according to an embodiment, a power source may be connected to the first bonding part 121 through a region of the first opening part TH1, and the power source may be connected to the second bonding part 122 through a region of the second opening part TH2.

Accordingly, the light emitting device 120 can be driven by a driving power supplied through the first bonding part 121 and the second bonding part 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling. Accordingly, the position of the light emitting device may be changed, so that optical and electrical properties and reliability of the light emitting device package may be deteriorated.

However, in the light emitting device package and the method of manufacturing a light emitting device package according to an embodiment, a bonding part of the light emitting device may receive a driving power through a conductive layer disposed in an opening part. In addition, a melting point of the conductive layer disposed in the opening part may be selected to be a value higher than a melting point of a typical bonding material and a melting point of an IMC layer.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Next, a light emitting device package according to another embodiment will be described with reference to FIG. 8.

Figure 8:
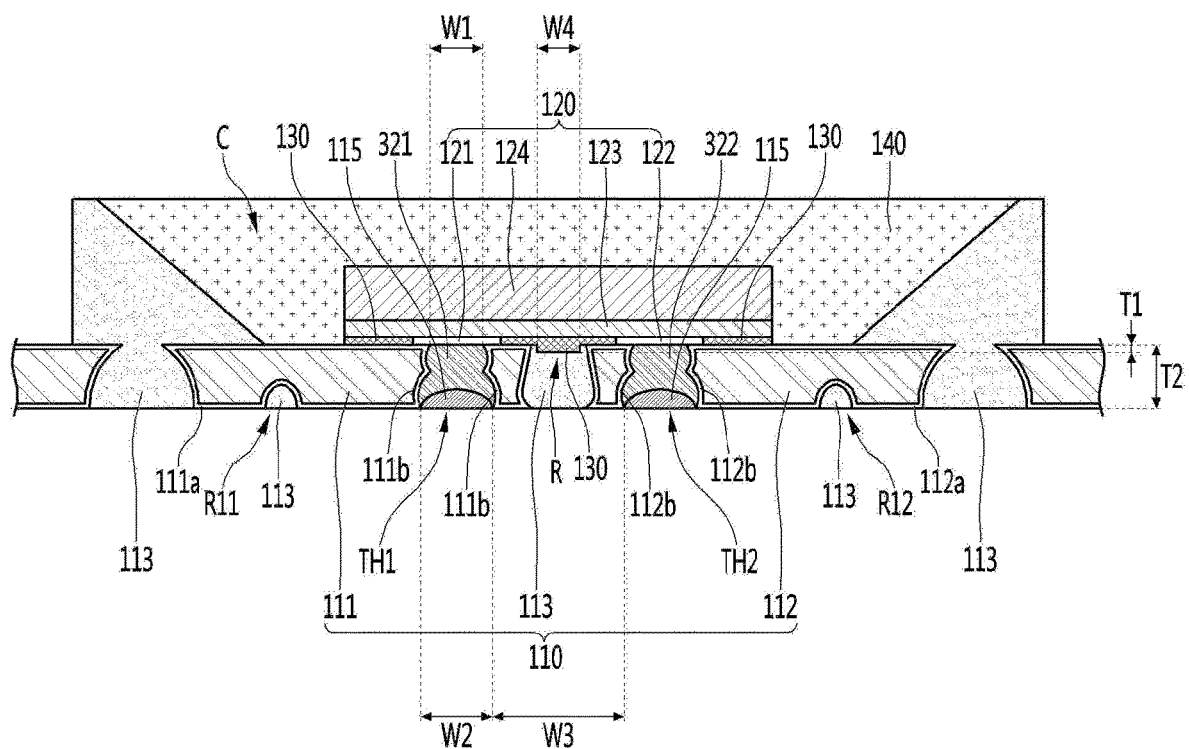
FIG. 8 is a view showing another example of a light emitting device package according to an embodiment of the present invention.

FIG. 8 is a view showing a light emitting device package according to another embodiment of the present invention. While describing the light emitting device package according to an embodiment with reference to FIG. 8, the descriptions that overlap with those described with reference to FIGS. 1 to 7 may be omitted.

As shown in FIG. 8, the light emitting device package according to the embodiment may include a resin layer 115 disposed in the first and second openings TH1 and TH2. The resin layer 115 may be disposed under the first and second conductive layers 321 and 322.

The resin layer 115 may protect the first and second conductive layers 321 and 322. The resin layer 115 may seal the first and second openings TH1 and TH2. The resin layer 115 may prevent the first and second conductive layers 321 and 322 from being diffused and moved to lower portions of the first and second openings TH1 and TH2.

For example, the resin layer 115 may include a material similar to the body 113. The resin layer 115 may include at least one material selected from the group including polyphthalamide (PPA) resin, polycyclohexylenedimethylene terephthalate (PCT) resin, epoxy molding compound (EMC) resin and silicone molding compound (SMC) resin.

In addition, the resin layer 115 may include at least one of an epoxy-based material, a silicone-based material, and a hybrid material including the epoxy-based material and the silicon-based material.

Next, a light emitting device package according to another embodiment will be described with reference to FIG. 9.

Figure 9:
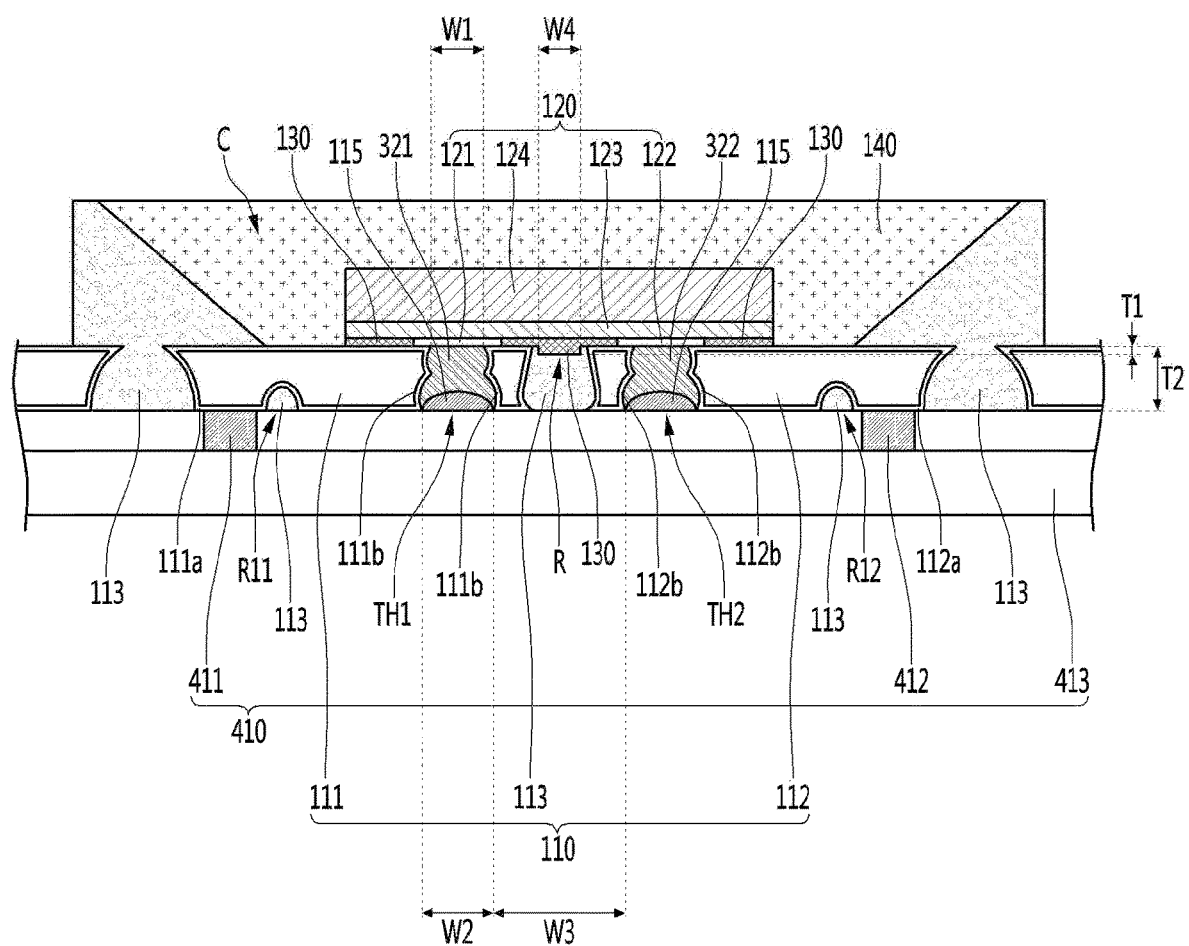
FIG. 9 is a view showing still another example of a light emitting device package according to an embodiment of the present invention.

In addition, the light emitting device package according to an embodiment of the present invention shown in FIG. 9 is an example in which the light emitting device package described with reference to FIGS. 1 to 8 is mounted on a circuit board 410 and provided.

While describing the light emitting device package according to an embodiment of the present invention with reference to FIG. 9, the descriptions that overlap with those described with reference to FIGS. 1 to 8 may be omitted.

According to an embodiment, as shown in FIG. 9, the light emitting device package may include a circuit board 410, the package body 110, and the light emitting device 120.

The circuit board 410 may include a first pad 411, a second pad 412, and a substrate 413. The substrate 413 may be provided with a power supply circuit for controlling the driving of the light emitting device 120.

The package body 110 may be disposed on the circuit board 410. The first pad 411 and the first bonding part 121 may be electrically connected to each other. The second pad 412 and the second bonding part 122 may be electrically connected to each other.

The first pad 411 and the second pad 412 may include a conductive material. For example, the first pad 411 and the second pad 412 may include at least one material selected from the group consisting of Ti, Cu, Ni, Au, Cr, Ta, Pt, Sn, Ag, P, Fe, Sn, Zn and Al, or an alloy thereof. The first pad 411 and the second pad 412 may be composed of a single layer or a multilayer.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line.

The first frame 111 and the second frame 112 may be conductive frames. The first frame 111 and the second frame 112 may provide stable the structural strength to the package body 110, and may be electrically connected to the light emitting device 120.

The package body 110 may include the first opening part TH1 and the second opening part TH2 provided from an upper surface toward a lower surface of the package body 110 in a first direction. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first bonding part 121 of the light emitting device 120. The first opening part TH1 may overlap with the first bonding part 121 of the light emitting device 120. The first opening part TH1 may overlap with the first bonding part 121 of the light emitting device 120 in the first direction, which is directed from the upper surface toward the lower surface of the first frame 111. The first bonding part 121 may be disposed on the first opening part TH1.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second bonding part 122 of the light emitting device 120. The second opening part TH2 may overlap with the second bonding part 122 of the light emitting device 120. The second opening part TH2 may overlap with the second bonding part 122 of the light emitting device 120 in the first direction, which is directed from the upper surface toward the lower surface of the second frame 112. The second bonding part 122 may be disposed on the second opening part TH2.

The first opening part TH1 and the second opening part TH2 may be spaced apart from each other. The first opening part TH1 and the second opening part TH2 may be spaced apart from each other under the lower surface of the light emitting device 120.

A first opening TH1 may include an upper region arranged adjacent to an upper surface of a first frame 111 and a lower region arranged adjacent to a lower surface of the first frame 111. For example, a periphery of the upper region of the first opening TH1 may be smaller than a periphery of the lower region of the first opening TH1.

The first opening TH1 includes a first point having a smallest periphery in a first direction and the first point may be closer to the upper region of the first opening than the upper region of the first opening TH1 based on a direction perpendicular to the first direction.

In addition, the first opening TH2 may include an upper region arranged adjacent to an upper surface of a second frame 112 and a lower region arranged adjacent to a lower surface of the second frame 1121. For example, a periphery of the upper region of the second opening TH2 may be smaller than a periphery of the lower region of the second opening TH2.

The second opening TH2 includes a first point where the second opening has a smallest periphery in the first direction and the first point may be closer to the upper region of the second opening Th2 than the upper region of the second opening TH2 based on the direction perpendicular to the first direction.

FIG. 9 shows the situation that the light emitting device package is etched in the top and bottom directions of first and second lead frames 111 and 112, respectively, in the process of forming the first and second openings TH1 and TH2.

As etching processes are separately performed in the top and bottom directions of the first and second lead frames 111 and 112, the first and second openings TH1 and TH2 may be provided in a shape of a snowman.

Each width of the first and second openings TH1 and TH2 may gradually increase and then decrease again from the lower region to a middle region thereof. In addition, the width may gradually increase and then decrease again to the upper region from the middle region where the width is decreased.

The aforementioned first point of the first and second openings TH1 and TH2 may denote a boundary region in which the size of the opening in the snowman shape decreases and then increases again from the lower region to the upper region.

The first and second openings TH1 and TH2 may include a first region arranged on each of the upper surface of the first and second frames 111 and 112 and a second region arranged on each of the lower surface of the first and second frames 111 and 112. The width of the upper surface of the first region may be smaller than the width of the lower surface of the second region.

In addition, the first and second frames 111 and 112 may include a support member and first and second metal layers 111a and 112a surrounding the support member.

According to the embodiment, after the etching process of forming the first and second openings TH1 and TH2 is completed, the first and second metal layers 111a and 112a may be formed by a plating process and so on with respect to the support member constituting the first and second frame 111 and 112. Accordingly, the first and second metal layers 111a and 112a may be provided on surfaces of the support members constituting the first and second frames 111 and 112, respectively.

The first and second metal layers 111a and 112a may be provided on upper and lower surfaces of the first and second frames 111 and 112, respectively. In addition, the first and second metal layers 111a and 112a may be provided in a boundary region making contact with the first and second openings TH1 and TH2, respectively.

In addition, the first and second metal layers 111a and 112a provided in the boundary region making contact with the first and second openings TH1 and TH2 may be combined with the first and second conductive layers 321 and 322 provided in the first and second openings TH1 and TH2, thereby forming first and second alloy layers 111b and 112b, respectively. The formation of the first and second alloy layers 111b and 112b will be described later.

For example, the first and second frames 111 and 112 may be provided with a Cu layer as a basic support member. In addition, the first and second metal layers 111a and 112a may include at least one of a Ni layer, an Ag layer, and the like.

In the situation that the first and second metal layers 111a and 112a include a Ni layer, because the Ni layer has a small change with respect to thermal expansion, the position of the light emitting device disposed on the upper side may be stably fixed by the Ni layer even when the size or arranged position of the package body is changed due to the thermal expansion. In the situation that the first and second metal layers 111a and 112a include an Ag layer, the Ag layer may efficiently reflect light emitted from the light emitting device disposed on the upper side thereof and improve light intensity.

According to the embodiment, when the first and second bonding parts 121 and 122 of the light emitting device 120 are arranged to have a small size to improve the light extraction efficiency, the width of the upper region of the first opening TH1 may be greater than or equal to the width of the first bonding part 121. In addition, the width of the upper region of the second opening TH2 may be greater than or equal to the width of the second bonding part 122.

In addition, the width of the upper region of the first opening part TH1 may be less than or equal to the width of a lower region of the first opening part TH1. In addition, the width of the upper region of the second opening part TH2 may be less than or equal to the width of a lower region of the second opening part TH2.

For example, the width of the upper region of the first opening TH1 may be in the range of tens of micrometers to hundreds of micrometers. In addition, the width of the lower region of the first opening TH1 may be tens of micrometers to hundreds of micrometers greater than the width of the upper region of the first opening TH1.

In addition, the width of the upper region of the second opening TH2 may be in the range of tens of micrometers to hundreds of micrometers. In addition, the width of the lower region of the second opening TH2 may be tens of micrometers to hundreds of micrometers greater than the width of the upper region of the second opening TH2.

According to an embodiment, as shown in FIG. 9, the light emitting device package 400 may include a first resin 130.

The first resin 130 may be disposed between the body 113 and the light emitting device 120. The first resin 130 may be disposed between an upper surface of the body 113 and a lower surface of the light emitting device 120.

In addition, according to an embodiment, as shown in FIG. 9, the light emitting device package may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may make contact with a side surface of the first bonding part 121 and a side surface of the second bonding part 122.

The first resin 130 may provide stable fixing strength between the light emitting device 120 and the package body 110. The first resin 130 may provide the stable fixing strength between the light emitting device 120 and the body 113. The first resin 130 may make, for example, direct contact with the upper surface of the body 113. In addition, the first resin 130 may make direct contact with the lower surface of the light emitting device 120.

For example, the first resin 130 may include at least one of an epoxy-based material, a silicone-based material, a hybrid material including the epoxy-based material and the silicone-based material. For example, the first resin 130 may include white silicone.

The first resin 130 may provide the stable fixing strength between the body 113 and the light emitting device 120, and if light is emitted through the lower surface of the light emitting device 120, the first resin 130 may provide a light diffusion function between the light emitting device 120 and the body 113. When the light is emitted from the light emitting device 120 through the lower surface of the light emitting device 120, the first resin 130 may improve light extraction efficiency of the light emitting device package 100 by the light diffusion function. In addition, the first resin 130 may reflect the light emitted from the light emitting device 120. In the situation of the first resin 130 including a reflection function, the first resin 130 may be formed of a material including $TiO_2$, $SiO_2$ or the like.

In addition, the light emitting device package according to the embodiment may include a molding part 140. The molding part 140 may be provided on the light emitting device 120. The molding part 140 may be disposed on the first frame 111 and the second frame 112. The molding part 140 may be disposed in the cavity C provided by the package body 110.

In addition, according to an embodiment, as shown in FIG. 9, the light emitting device package may include a first conductive layer 321 and a second conductive layer 322. The first conductive layer 321 may be spaced apart from the second conductive layer 322.

The first conductive layer 321 may be provided in the first opening part TH1. The first conductive layer 321 may be disposed under the first bonding part 121. A width of the first conductive layer 321 may be smaller than a width of the first bonding part 121.

The first bonding part 121 may have a width defined in a second direction perpendicular to the first direction along which the first opening part TH1 is provided. The width of the first bonding part 121 may be larger than the width of the first opening part TH1 in the second direction.

The first conductive layer 321 may make direct contact with a lower surface of the first bonding part 121. The first conductive layer 321 may be electrically connected to the first bonding part 121. The first conductive layer 321 may be surrounded by the first frame 111. The first conductive layer 321 may include a lower surface concavely provided in a direction from a lower portion to an upper portion thereof.

The second conductive layer 322 may be provided in the second opening part TH2. The second conductive layer 322 may be disposed under the second bonding part 122. A width of the second conductive layer 322 may be smaller than a width of the second bonding part 122.

The second bonding part 122 may have a width defined in the second direction perpendicular to the first direction along which the second opening part TH2 is provided. The width of the second bonding part 122 may be larger than the width of the second opening part TH2 in the second direction.

The second conductive layer 322 may make direct contact with a lower surface of the second bonding part 122. The second conductive layer 322 may be electrically connected to the second bonding part 122. The second conductive layer 322 may be surrounded by the second frame 112. The second conductive layer 322 may include a lower surface concavely provided in a direction from a lower portion to an upper portion thereof.

The first conductive layer 321 and the second conductive layer 322 may include one material selected from the group consisting of Ag, Au, Pt, Sn, Cu and the like, or an alloy thereof. However, embodiments are not limited thereto, and the first conductive layer 321 and the second conductive layer 322 may be formed of a material capable of ensuring a conduction function.

According to the embodiment, the first pad 411 of the circuit board 410 may be electrically connected to the first conductive layer 321. In addition, the second pad 412 of the circuit board 410 may be electrically connected to the second conductive layer 322.

The first pad 411 may be electrically connected to the first frame 111. In addition, the second pad 412 may be electrically connected to the second frame 112.

For example, the first conductive layer 321 and the second conductive layer 322 may be formed of a conductive paste. The conductive paste may include a solder paste, a silver paste or the like, and may be composed of a multilayer formed of mutually different materials, or a multilayer or a single layer formed of an alloy. For example, the first conductive layer 321 and the second conductive layer 322 may include SAC(Sn—Ag—Cu).

According to the embodiment, in the process of forming the first and second conductive layers 321 and 322 or in the heat treatment process after providing the first and second conductive layers 321 and 322, an intermetallic compound (IMC) layer may be provided between the first and second conductive layers 321 and 322 and the first and second frames 111 and 112.

For example, first and second alloy layers 111b and 112b may be formed by the combination between materials of the first and second conductive layers 321 and 322 and the first and second metal layers 111a and 112a of the first and second frames 111 and 112, respectively.

Accordingly, the first conductive layer 321 and the first frame 111 may be stably coupled to each other physically and electrically. The first conductive layer 321, the first alloy layer 111b, and the first frame 111 may be stably coupled to each other physically and electrically.

In addition, the second conductive layer 322 and the second frame 112 may be stably coupled to each other physically and electrically. The second conductive layer 322, the second alloy layer 112b, and the second frame 112 may be stably coupled to each other physically and electrically.

For example, the first and second alloy layers 111b and 112b may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second metal layer 111a and 112a or the support members of the first and second frames 111 and 112.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second metal layers 111a and 112a include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include the Sn material and the first and second metal layers 111a and 112a include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include the Sn material and the support member of the first and second frames 111 and 112 include a Cu material, an intermetallic compound layer of CuSn may be formed by the combination of the Sn material and the Cu material in the process of providing the first and second conductive layers 321 and 322, or in the heat treatment process thereafter.

In addition, when the first and second conductive layers 321 and 322 include the Ag material and the support member of the first and second frames 111 and 112 include the Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, according to the embodiment, the intermetallic compound layer may also be provided between the first and second bonding parts 121 and 122 and the first and second conductive layers 321 and 322.

As similar to the above description, according to the embodiment, in the process of forming the first and second conductive layers 321 and 322 or in the heat treatment process after providing the first and second conductive layers 321 and 322, the intermetallic compound (IMC) layer may be provided between the first and second conductive layers 321 and 322 and the first and second bonding parts 121 and 122.

For example, an alloy layer may be formed by the combination between materials constituting the first and second conductive layers 321 and 322 and the first and second bonding parts 121 and 122.

Accordingly, the first conductive layer 321 and the first bonding part 121 may be stably coupled to each other physically and electrically. The first conductive layer 321, the alloy layer, and the first bonding part 121 may be stably coupled to each other physically and electrically.

In addition, the second conductive layer 322 and the second bonding part 122 may be stably coupled to each other physically and electrically. The second conductive layer 322, the alloy layer, and the second bonding part 122 may be stably coupled to each other physically and electrically.

For example, the alloy layer may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second bonding parts 121 and 122.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second bonding parts 121 and 122 include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include an Sn material and the first and second bonding parts 121 and 122 include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include an Ag material and the first and second bonding parts 121 and 122 include an Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, according to an embodiment, as shown in FIG. 9, the light emitting device package may include a first lower recess R11 and a second lower recess R12. The first lower recess R11 and the second lower recess R12 may be spaced apart from each other.

The first lower recess R11 may be provided in a lower surface of the first frame 111. The first lower recess R11 may be concavely provided from the lower surface toward an upper surface of the first frame 111. The first lower recess R11 may be spaced apart from the first opening part TH1.

The first lower recess R11 may have a width of several micrometers to several tens of micrometers. A resin part may be provided in the first lower recess R11. The resin part filled in the first lower recess R11 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the first lower recess R11 may be provided in a process of forming the first frame 111, the second frame 112, and the body 113 through an injection molding process or the like.

The resin part filled in the first lower recess R11 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as described above with reference to FIG. 2, the lower surface region of the first frame 111 provided with the first opening part TH1 may be isolated from the first frame 111 around the lower surface region by the resin part filled in the first lower recess R11 and the body 113.

Therefore, if the resin part is formed of a material representing low adhesive strength and low wettability with the first and second conductive layers 321 and 322, or a material representing low surface tension between the resin part and the first and second conductive layers 321 and 322, the first conductive layer 321 provided in the first opening part TH1 can be prevented from being diffused over the resin part filled in the first lower recess R11 or the body 113 by overflowing from the first opening part TH1.

This is based on adhesion relation between the first conductive layer 321 and the resin part and between the first conductive layer 321 and the body 113, or the low wettability and low surface tension between the resin part and the first and second conductive layers 321 and 322. In other words, a material constituting the first conductive layer 321 may be selected to represent good adhesion with the first frame 111. In addition, the material constituting the first conductive layer 321 may be selected to represent low adhesion with the resin part and the body 113.

Accordingly, the first conductive layer 321 is prevented from flowing out or spreading to an outside of the region where the resin part or the body 113 is provided by flowing out from the first opening part TH1 toward a region where the resin part or the body 113 is provided, and the first conductive layer 321 can be stably disposed in a region where the first opening part TH1 is provided.

Therefore, if the first conductive layer 321 disposed in the first opening part TH1 flows out, the first conductive layer 321 can be prevented from expanding to an external region of the resin part or the first lower recess R11 provided with the body 113. In addition, the first conductive layer 321 can be stably connected to the lower surface of the first bonding part 121 in the first opening part TH1.

In addition, according to the embodiment, a resin layer 115 may be disposed under the first conductive layer 321 in the first opening part TH1. The resin layer 115 may seal a lower surface of the first opening part TH1.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in a process of disposing the first and second conductive layers 321 and 322.

In addition, the second lower recess R12 may be provided in a lower surface of the second frame 112. The second lower recess R12 may be concavely provided from the lower surface toward an upper surface of the second frame 112. The second lower recess R12 may be spaced apart from the second opening part TH2.

The second lower recess R12 may have a width of several micrometers to several tens of micrometers. The resin part may be provided in the second lower recess R12. The resin part filled in the second lower recess R12 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the second lower recess R12 may be provided in the process of forming the first frame 111, the second frame 112, and the body 113 through an injection molding process or the like.

The resin part filled in the second lower recess R12 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as described above with reference to FIG. 2, the lower surface region of the second frame 112 provided with the second opening part TH2 may be isolated from the second frame 112 around the lower surface region by the resin part filled in the second lower recess R12 and the body 113.

Therefore, if the resin part is formed of a material representing low adhesive strength and low wettability with the first and second conductive layers 321 and 322, or a material representing low surface tension between the resin part and the first and second conductive layers 321 and 322, the second conductive layer 322 provided in the second opening part TH2 can be prevented from being diffused over the resin part filled in the second lower recess R12 or the body 113 by overflowing from the second opening part TH2.

This is based on adhesion relation between the second conductive layer 322 and the resin part and between the second conductive layer 322 and the body 113, or the low wettability and low surface tension between the resin part and the first and second conductive layers 321 and 322. In other words, a material constituting the second conductive layer 322 may be selected to represent good adhesion with the second frame 112. In addition, the material constituting the second conductive layer 322 may be selected to represent low adhesion with the resin part and the body 113.

Accordingly, the second conductive layer 322 is prevented from flowing out or spreading to an outside of the region where the resin part or the body 113 is provided by flowing out from the second opening part TH2 toward a region where the resin part or the body 113 is provided, and the second conductive layer 322 can be stably disposed in a region where the second opening part TH2 is provided.

Therefore, if the second conductive layer 322 disposed in the second opening part TH2 flows out, the second conductive layer 322 can be prevented from expanding to an external region of the resin part or the second lower recess R12 provided with the body 113. In addition, the second conductive layer 322 can be stably connected to the lower surface of the second bonding part 122 in the second opening part TH2.

In addition, according to the embodiment, a resin layer 115 may be disposed under the second conductive layer 322 in the second opening part TH2. The resin layer 115 may seal a lower surface of the second opening part TH2.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in the process of disposing the first and second conductive layers 321 and 322.

In addition, according to the embodiment, a separate bonding layer may be additionally provided between the first pad 411 and the first frame 111. In addition, a separate bonding layer may be additionally provided between the second pad 412 and the second frame 112.

According to the embodiment, similarly to the above description, in the process of mounting the package body 110 on the circuit board 410, a material constituting the first pad 411 or a bonding material provided on the first pad 411 may be prevented from being diffused and moved toward the first opening TH1 by a resin part provided in the first opening TH1.

In addition, according to the embodiment, in the process of mounting the package body 110 on the circuit board 410, a material constituting the second pad 412 or a bonding material provided on the second pad 412 may be prevented from being diffused and moved toward the second opening TH2 by a resin part provided in the second opening TH2.

In addition, according to the light emitting device package of the embodiment, as shown in FIG. 9, the first resin 130 provided in the recess R may be provided between the lower surface of the light emitting device 120 and the upper surface of the package body 110. When viewed from the top of the light emitting device 120, the first resin 130 may be provided around the first and second bonding parts 121 and 122. In addition, when viewed from the top of the light emitting device 120, the first resin 130 may be provided around the first and second openings TH1 and TH2.

The first resin 130 may function to stably fix the light emitting device 120 to the package body 110. In addition, the first resin 130 may be disposed around the first and second bonding parts 121 and 122 and in contact with side surfaces of the first and second bonding parts 121 and 122.

The first resin 130 may seal peripheries of the first bonding part 121 and the second bonding part 122. The resin 130 may prevent the first conductive layer 321 and the second conductive layer 322 from being diffused and moved by overflowing from regions of the first opening TH1 and the second opening TH2 outward of the light emitting device 120. When the first and second conductive layers 321 and 322 are diffused and moved outward of the light emitting device 120, a failure due to a short may be caused since the first and second conductive layers 321 and 322 may make contact with the active layer of the light emitting device 120. Accordingly, when the first resin 130 is disposed, the short caused by the first and second conductive layers 321 and 322 and the active layer may be prevented, thereby improving the reliability of the light emitting device package according to the embodiment.

In addition, the resin 130 may prevent the first conductive layer 321 and the second conductive layer 322 from being diffused and moved by overflowing from regions of the first opening TH1 and the second opening TH2 under the lower surface of the light emitting device 120 in the direction of the recess. Accordingly, the first conductive layer 321 and the second conductive layer 322 may be prevented from being electrically short-circuited under the light emitting device 120.

In the light emitting device package according to the embodiment described with reference to FIG. 9, power supplied from the circuit board 410 is transmitted to the first bonding part 121 and the second bonding part 122 through the first conductive layer 321 and the second conductive layer 322, respectively. Herein, the first pad 411 of the circuit board 410 may make direct contact with the first frame 111, and the second pad 412 of the circuit board 410 may make direct contact with the second frame 112.

As described above, in the light emitting device package and the method of manufacturing a light emitting device package according to an embodiment, a bonding part of the light emitting device may receive a driving power through a conductive layer disposed in an opening part. In addition, a melting point of the conductive layer disposed in the opening part may be selected to be a value higher than a melting point of a typical bonding material and a melting point of an IMC layer.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, the aforementioned light emitting device package according to the embodiment has been described based on the situation that one opening is provided under each bonding part.

However, according to a light emitting device package of another embodiment, a plurality of openings may be provided under the bonding part. Further, the openings may have widths different from each other.

In addition, the opening according to the embodiment may be provided in various shapes.

For example, the opening according to the embodiment may have a same width from the upper region to the lower region thereof.

In addition, the opening according to the embodiment may be provided in a shape of a multi-stage structure. For example, the opening may be provided in a shape of a two-stage structure having different inclination angles. In addition, the opening may be provided in a shape of three stages or more having different inclination angles.

In addition, the opening may be provided in a shape in which the width changes from the upper region to the lower region thereof. For example, the opening may be provided in a shape having a curvature from the upper region to the lower region thereof.

In addition, according to the above light emitting device package of the embodiment, the package body 110 may be provided to include only the support member 113 having a flat upper surface and exclude an inclined reflective part.

In other words, according to the light emitting device package of the embodiment, the package body 110 may have a structure to form a cavity C. In addition, the package body 110 may be provided with a structure in which the upper surface thereof is flat without forming the cavity C.

Next, a light emitting device package according to another embodiment will be described with reference to FIG. 10.

Figure 10:
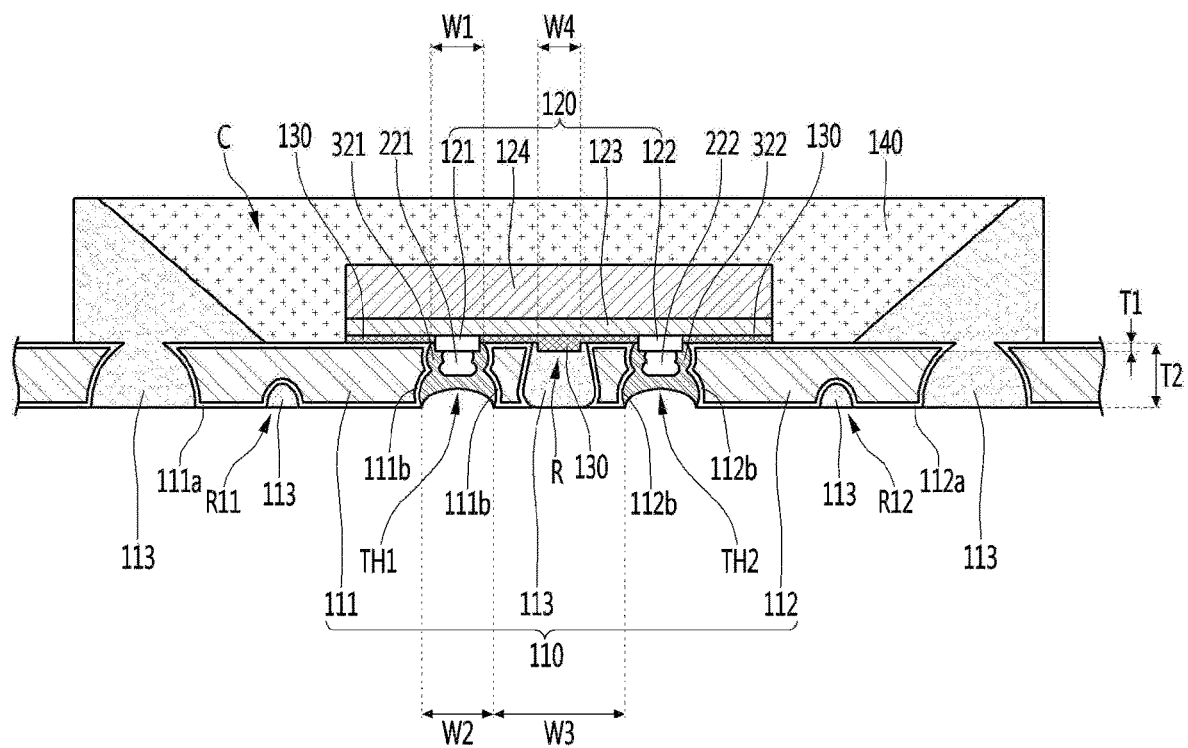
FIG. 10 is a view showing still another example of a light emitting device package according to an embodiment of the present invention.

FIG. 10 is a view showing a light emitting device package according to another embodiment of the present invention. While describing the light emitting device package according to an embodiment with reference to FIG. 10, the descriptions that overlap with those described with reference to FIGS. 1 to 9 may be omitted.

According to an embodiment, as shown in FIG. 10, a light emitting device package may include a package body 110 and a light emitting device 120.

The package body 110 may include a first frame 111 and a second frame 112. The first frame 111 and the second frame 112 may be spaced apart from each other.

The package body 110 may include a body 113. The body 113 may be disposed between the first frame 111 and the second frame 112. The body 113 may function as a sort of an electrode separation line. The body 113 may be also referred to as an insulating member.

The body 113 may be disposed on the first frame 111. In addition, the body 113 may be disposed on the second frame 112.

The body 113 may be provided with an inclined surface disposed on the first frame 111 and the second frame 112. Due to the inclined surface of the body 113, a cavity C may be provided over the first frame 111 and the second frame 112.

According to an embodiment, the package body 110 may have a structure provided with the cavity C, or may have a structure provided with a flat upper surface without the cavity C For example, the body 113 may be formed of a material selected from the group consisting of polyphthalamide (PPA), polychloro tri phenyl (PCT), liquid crystal polymer (LCP), polyamide9T (PA9T), silicone, an epoxy molding compound (EMC), a silicone molding compound (SMC), ceramic, a photo sensitive glass (PSG), a sapphire ($Al_2O_3$), and the like. In addition, the body 113 may include a high refractive filler such as $TiO_2$ and $SiO_2$.

According to the embodiment, the light emitting device 120 may include a first bonding part 121, a second bonding part 122, a light emitting structure 123, and a substrate 124.

The first bonding part 121 may be disposed on a lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

In addition, as shown in FIG. 10, the light emitting device package according to the embodiment may include a first opening part TH1 and a second opening part TH2. The first frame 111 may include the first opening part TH1. The second frame 112 may include the second opening part TH2.

The first opening part TH1 may be provided in the first frame 111. The first opening part TH1 may be provided through the first frame 111. The first opening part TH1 may be provided through an upper surface and a lower surface of the first frame 111 in a first direction.

The first opening part TH1 may be arranged under the first bonding part 121 of the light emitting device 120. The first opening part TH1 may overlap with the first bonding part 121 of the light emitting device 120. The first opening part TH1 may overlap with the first bonding part 121 of the light emitting device 120 in the first direction, which is directed from the upper surface toward the lower surface of the first frame 111. The first bonding part 121 may be disposed on the first opening part TH1.

The second opening part TH2 may be provided in the second frame 112. The second opening part TH2 may be provided through the second frame 112. The second opening part TH2 may be provided through an upper surface and a lower surface of the second frame 112 in the first direction.

The second opening part TH2 may be arranged under the second bonding part 122 of the light emitting device 120. The second opening part TH2 may overlap with the second bonding part 122 of the light emitting device 120. The second opening part TH2 may overlap with the second bonding part 122 of the light emitting device 120 in the first direction, which is directed from the upper surface toward the lower surface of the second frame 112. The second bonding part 122 may be disposed on the second opening part TH2.

The first opening part TH1 and the second opening part TH2 may be spaced apart from each other. The first opening part TH1 and the second opening part TH2 may be spaced apart from each other under the lower surface of the light emitting device 120.

A first opening TH1 may include an upper region arranged adjacent to an upper surface of a first frame 111 and a lower region arranged adjacent to a lower surface of the first frame 111. For example, a periphery of the upper region of the first opening TH1 may be smaller than a periphery of the lower region of the first opening TH1.

The first opening TH1 includes a first point having a smallest periphery in a first direction and the first point may be closer to the upper region of the first opening than the upper region of the first opening TH1 based on a direction perpendicular to the first direction.

In addition, the first opening TH2 may include an upper region arranged adjacent to an upper surface of a second frame 112 and a lower region arranged adjacent to a lower surface of the second frame 1121. For example, a periphery of the upper region of the second opening TH2 may be smaller than a periphery of the lower region of the second opening TH2.

The second opening TH2 includes a first point where the second opening has a smallest periphery in the first direction and the first point may be closer to the upper region of the second opening Th2 than the upper region of the second opening TH2 based on the direction perpendicular to the first direction.

FIG. 10 shows the situation that the light emitting device package is etched in the top and bottom directions of first and second lead frames 111 and 112, respectively, in the process of forming the first and second openings TH1 and TH2.

As etching processes are separately performed in the top and bottom directions of the first and second lead frames 111 and 112, the first and second openings TH1 and TH2 may be provided in a shape of a snowman (e.g., one or more spherical shapes that are connected).

Each width of the first and second openings TH1 and TH2 may gradually increase and then decrease again from the lower region to a middle region thereof. In addition, the width may gradually increase and then decrease again to the upper region from the middle region where the width is decreased.

The aforementioned first point of the first and second openings TH1 and TH2 may denote a boundary region in which the size of the opening in the snowman shape decreases and then increases again from the lower region to the upper region.

The first and second openings TH1 and TH2 may include a first region arranged on each of the upper surface of the first and second frames 111 and 112 and a second region arranged on each of the lower surface of the first and second frames 111 and 112. The width of the upper surface of the first region may be smaller than the width of the lower surface of the second region.

In addition, the first and second frames 111 and 112 may include a support member and first and second metal layers 111*a* and 112*a* surrounding the support member.

According to the embodiment, after the etching process of forming the first and second openings TH1 and TH2 is completed, the first and second metal layers 111*a* and 112*a* may be formed by a plating process and so on with respect to the support member constituting the first and second frame 111 and 112. Accordingly, the first and second metal layers 111*a* and 112*a* may be provided on surfaces of the support members constituting the first and second frames 111 and 112, respectively.

The first and second metal layers 111*a* and 112*a* may be provided on upper and lower surfaces of the first and second frames 111 and 112, respectively. In addition, the first and second metal layers 111*a* and 112*a* may be provided in a boundary region making contact with the first and second openings TH1 and TH2, respectively.

In addition, the first and second metal layers 111*a* and 112*a* provided in the boundary region making contact with the first and second openings TH1 and TH2 may be combined with the first and second conductive layers 321 and 322 provided in the first and second openings TH1 and TH2, thereby forming first and second alloy layers 111b and 112b, respectively. The formation of the first and second alloy layers 111b and 112b will be described later.

For example, the first and second frames 111 and 112 may be provided with a Cu layer as a basic support member. In addition, the first and second metal layers 111a and 112a may include at least one of a Ni layer, an Ag layer, and the like.

In the situation that the first and second metal layers 111a and 112a include a Ni layer, because the Ni layer has a small change with respect to thermal expansion, the position of the light emitting device disposed on the upper side may be stably fixed by the Ni layer even when the size or arranged position of the package body is changed due to the thermal expansion. In the situation that the first and second metal layers 111a and 112a include an Ag layer, the Ag layer may efficiently reflect light emitted from the light emitting device disposed on the upper side thereof and improve light intensity.

According to the embodiment, when the first and second bonding parts 121 and 122 of the light emitting device 120 are arranged to have a small size to improve the light extraction efficiency, the width of the upper region of the first opening TH1 may be greater than or equal to the width of the first bonding part 121. In addition, the width of the upper region of the second opening TH2 may be greater than or equal to the width of the second bonding part 122.

In addition, the width of the upper region of the first opening part TH1 may be less than or equal to the width of a lower region of the first opening part TH1. In addition, the width of the upper region of the second opening part TH2 may be less than or equal to the width of a lower region of the second opening part TH2.

For example, the width of the upper region of the first opening TH1 may be in the range of tens of micrometers to hundreds of micrometers. In addition, the width of the lower region of the first opening TH1 may be tens of micrometers to hundreds of micrometers greater than the width of the upper region of the first opening TH1.

In addition, the width of the upper region of the second opening TH2 may be in the range of tens of micrometers to hundreds of micrometers. In addition, the width of the lower region of the second opening TH2 may be tens of micrometers to hundreds of micrometers greater than the width of the upper region of the second opening TH2.

According to an embodiment, the light emitting device package may include a first resin 130.

The first resin 130 may be disposed between the body 113 and the light emitting device 120. The first resin 130 may be disposed between an upper surface of the body 113 and a lower surface of the light emitting device 120.

In addition, according to an embodiment, as shown in FIG. 10, the light emitting device package may include a recess R.

The recess R may be provided in the body 113. The recess R may be provided between the first opening part TH1 and the second opening part TH2. The recess R may be concavely provided from an upper surface toward a lower surface of the body 113. The recess R may be arranged under the light emitting device 120. The recess R may overlap with the light emitting device 120 in the first direction.

For example, the first resin 130 may be disposed in the recess R. The first resin 130 may be disposed between the light emitting device 120 and the body 113. The first resin 130 may be disposed between the first bonding part 121 and the second bonding part 122. For example, the first resin 130 may make contact with a side surface of the first bonding part 121 and a side surface of the second bonding part 122.

The first resin 130 may provide stable fixing strength between the light emitting device 120 and the package body 110. The first resin 130 may provide the stable fixing strength between the light emitting device 120 and the body 113. The first resin 130 may make, for example, direct contact with the upper surface of the body 113. In addition, the first resin 130 may make direct contact with the lower surface of the light emitting device 120.

For example, the first resin 130 may include at least one of an epoxy-based material, a silicone-based material, a hybrid material including the epoxy-based material and the silicone-based material. In addition, for example, if the first resin 130 includes a reflection function, the adhesive may include white silicone.

The first resin 130 may provide the stable fixing strength between the body 113 and the light emitting device 120, and if light is emitted through the lower surface of the light emitting device 120, the first resin 130 may provide a light diffusion function between the light emitting device 120 and the body 113. When the light is emitted from the light emitting device 120 through the lower surface of the light emitting device 120, the first resin 130 may improve light extraction efficiency of the light emitting device package 100 by the light diffusion function. In addition, the first resin 130 may reflect the light emitted from the light emitting device 120. In the situation of the first resin 130 including a reflection function, the first resin 130 may be formed of a material including $TiO_2$, Silicone or the like.

In addition, the light emitting device package according to the embodiment may include a molding part 140.

The molding part 140 may be provided on the light emitting device 120. The molding part 140 may be disposed on the first frame 111 and the second frame 112. The molding part 140 may be disposed in the cavity C provided by the package body 110.

According to an embodiment, as shown in FIG. 10, the light emitting device package may include a first conductor 221 and a second conductor 222. In addition, the light emitting device package may include a first conductive layer 321 and a second conductive layer 322. The first conductive layer 321 may be spaced apart from the second conductive layer 322.

The first conductor 221 may be disposed under the first bonding part 121. The first conductor 221 may be electrically connected to the first bonding part 121. The first conductor 221 may be overlapped with the first bonding part 121 in the first direction.

The first conductor 221 may be provided on the first opening TH1. The first conductor 221 may be disposed between the first bonding part 121 and the first conductive layer 321. The first conductor 221 may be electrically connected to the first bonding part 121 and the first conductive layer 321.

A lower surface of the first conductor 221 may be arranged lower than an upper surface of the first opening TH1. The lower surface of the first conductor 221 may be arranged lower than an upper surface of the first conductive layer 321.

The first conductor 221 may be disposed on the first opening TH1. In addition, the first conductor 221 may extend from the first bonding part 121 to the inside of the first opening TH1.

In addition, the second conductor 222 may be disposed under the second bonding part 122. The second conductor 222 may be electrically connected to the second bonding part 122. The second conductor 222 may be disposed to overlap the second bonding part 122 in the first direction.

The second conductor 222 may be provided on the second opening TH2. The second conductor 222 may be disposed between the second bonding part 122 and the second conductive layer 322. The second conductor 222 may be electrically connected to the second bonding part 122 and the second conductive layer 322.

A lower surface of the second conductor 222 may be arranged lower than an upper surface of the second opening TH2. The lower surface of the second conductor 221 may be arranged lower than an upper surface of the second conductive layer 322.

The second conductor 222 may be disposed on the second opening TH2. In addition, the second conductor 222 may extend from the second bonding part 122 to the inside of the second opening TH2.

According to the embodiment, the first conductive layer 321 may be disposed on the lower surface and a side surface of the first conductor 221. The first conductive layer 321 may make direct contact with the lower surface and the side surface of the first conductor 221. The lower surface of the first conductive layer 321 may be concavely provided in the direction from a lower side to an upper side thereof.

The first conductive layer 321 may be provided on the first opening TH1. The first conductive layer 321 may be disposed under the first bonding part 121. The width of the first conductive layer 321 may be greater than the width of the first bonding part 121.

According to the light emitting device package of the embodiment, the electrical connection between the first conductive layer 321 and the first bonding part 121 may be more stably provided by the first conductor 221.

In addition, according to the embodiment, the second conductive layer 322 may be disposed on the lower surface and a side surface of the second conductor 222. The second conductive layer 322 may make direct contact with the lower surface and the side surface of the second conductor 222. The lower surface of the second conductive layer 322 may be concavely provided in the direction from a lower side to an upper side thereof.

The second conductive layer 322 may be provided on the second opening TH2. The second conductive layer 322 may be disposed under the second bonding part 122. The width of the second conductive layer 322 may be greater than the width of the second bonding part 122.

According to the light emitting device package 200 of the embodiment, the electrical connection between the second conductive layer 322 and the second bonding part 122 may be more stably provided by the second conductor 222.

For example, the first and second conductors 221 and 222 may be stably bonded to the first and second bonding parts 121 and 122 through separate bonding materials, respectively. In addition, the side surfaces and the lower surfaces of the first and second conductors 221 and 222 may make contact with the first and second conductive layers 321 and 322, respectively. Thus, compared to the situation that the first and second conductive layers 321 and 322 make direct contact with the lower surfaces of the first and second bonding parts 121 and 122, the widths where the first and second conductive layers 321 and 322 make contact with the first and second conductors 221 and 222, respectively, may be greater. Accordingly, the power may be stably supplied from the first and second conductive layers 321 and 322 to the first and second bonding parts 121 and 122 through the first and second conductors 221 and 222, respectively.

The first conductive layer 321 and the second conductive layer 322 may include one material selected from the group consisting of Ag, Au, Pt, Sn, Cu and the like, or an alloy thereof. However, embodiments are not limited thereto, and the first conductive layer 321 and the second conductive layer 322 may be formed of a material capable of ensuring a conduction function.

For example, the first conductive layer 321 and the second conductive layer 322 may be formed of a conductive paste. The conductive paste may include a solder paste, a silver paste or the like, and may be composed of a multilayer formed of mutually different materials, or a multilayer or a single layer formed of an alloy. For example, the first conductive layer 321 and the second conductive layer 322 may include SAC(Sn—Ag—Cu).

According to the embodiment, in the process of forming the first and second conductive layers 321 and 322 or in the heat treatment process after providing the first and second conductive layers 321 and 322, an intermetallic compound (IMC) layer may be provided between the first and second conductive layers 321 and 322 and the first and second frames 111 and 112.

For example, first and second alloy layers 111b and 112b may be formed by the combination between materials of the first and second conductive layers 321 and 322 and the first and second metal layers 111a and 112a of the first and second frames 111 and 112, respectively.

Accordingly, the first conductive layer 321 and the first frame 111 may be stably coupled to each other physically and electrically. The first conductive layer 321, the first alloy layer 111b, and the first frame 111 may be stably coupled to each other physically and electrically.

In addition, the second conductive layer 322 and the second frame 112 may be stably coupled to each other physically and electrically. The second conductive layer 322, the second alloy layer 112b, and the second frame 112 may be stably coupled to each other physically and electrically.

For example, the first and second alloy layers 111b and 112b may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second metal layer 111a and 112a or the support members of the first and second frames 111 and 112.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second metal layers 111a and 112a include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include the Sn material and the first and second metal layers 111a and 112a include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include the Sn material and the support member of the first and second frames 111 and 112 include a Cu material, an intermetallic compound layer of CuSn may be formed by the combination of the Sn material and the Cu material in the process of providing the first and second conductive layers 321 and 322, or in the heat treatment process thereafter.

In addition, when the first and second conductive layers 321 and 322 include the Ag material and the support member of the first and second frames 111 and 112 include the Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

In addition, according to the embodiment, the intermetallic compound layer may also be provided between the first and second bonding parts 121 and 122 and the first and second conductive layers 321 and 322.

As similar to the above description, according to the embodiment, in the process of forming the first and second conductive layers 321 and 322 or in the heat treatment process after providing the first and second conductive layers 321 and 322, the intermetallic compound (IMC) layer may be provided between the first and second conductive layers 321 and 322 and the first and second bonding parts 121 and 122.

For example, an alloy layer may be formed by the combination between materials constituting the first and second conductive layers 321 and 322 and the first and second bonding parts 121 and 122.

Accordingly, the first conductive layer 321 and the first bonding part 121 may be stably coupled to each other physically and electrically. The first conductive layer 321, the alloy layer, and the first bonding part 121 may be stably coupled to each other physically and electrically.

In addition, the second conductive layer 322 and the second bonding part 122 may be stably coupled to each other physically and electrically. The second conductive layer 322, the alloy layer, and the second bonding part 122 may be stably coupled to each other physically and electrically.

For example, the alloy layer may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second bonding parts 121 and 122.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second bonding parts 121 and 122 include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include an Sn material and the first and second bonding parts 121 and 122 include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include an Ag material and the first and second bonding parts 121 and 122 include an Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, according to the embodiment, the intermetallic compound layer may also be provided between the first and second conductors 221 and 222 and the first and second conductive layers 321 and 322.

As similar to the above description, according to the embodiment, in the process of forming the first and second conductive layers 321 and 322 or in the heat treatment process after providing the first and second conductive layers 321 and 322, the intermetallic compound (IMC) layer may be provided between the first and second conductive layers 321 and 322 and the first and second conductors 221 and 222.

For example, an alloy layer may be formed by the combination between materials constituting the first and second conductive layers 321 and 322 and the first and second conductors 221 and 222.

Accordingly, the first conductive layer 321 and the first conductor 221 may be stably coupled to each other physically and electrically. The first conductive layer 321, the alloy layer, and the first conductor 221 may be stably coupled to each other physically and electrically.

In addition, the second conductive layer 322 and the second conductor 222 may be stably coupled to each other physically and electrically. The second conductive layer 322, the alloy layer, and the second conductor 222 may be stably coupled to each other physically and electrically.

For example, the alloy layer may include at least one intermetallic compound layer selected from the group including AgSn, CuSn, AuSn, and the like. The intermetallic compound layer may be formed by the combination of a first material and a second material, and the first material may be provided from the first and second conductive layers 321 and 322, and the second material may be provided from the first and second conductors 221 and 222.

According to the embodiment, the intermetallic compound layer may have a thickness of several micrometers. For example, the intermetallic compound layer may be provided to have the thickness of 1 micrometer to 3 micrometers.

When the first and second conductive layers 321 and 322 include an Sn material and the first and second conductors 221 and 222 include an Ag material, an intermetallic compound layer of AgSn may be formed by the combination of the Sn material and the Ag material in the process of providing the first and second conductive layers 321 and 322, or in the heat treatment process thereafter.

In addition, when the first and second conductive layers 321 and 322 include an Sn material and the first and second conductors 221 and 222 include an Au material, an intermetallic compound layer of AuSn may be formed by the combination of the Sn material and the Au material in the process of providing the first and second conductive layers 321 and 322, or in the heat treatment process thereafter.

In addition, when the first and second conductive layers 321 and 322 include an Ag material and the first and second conductors 221 and 222 include an Sn material, an intermetallic compound layer of AgSn may be formed by the combination of the Ag material and the Sn material in the process of providing the first and second conductive layers 321 and 322, or in the heat treatment process thereafter.

The aforementioned intermetallic compound layer may have a higher melting point than a general bonding material. In addition, the heat treatment process of forming the intermetallic compound layer may be performed at a temperature lower than the melting point of the general bonding material.

Thus, even when the light emitting device package 100 according to the embodiment is bonded to a main substrate or the like through a reflow process, re-melting phenomenon does not occur, so that electrical connection and physical bonding strength can be prevented from being deteriorated.

In addition, according to an embodiment, as shown in FIG. 10, the light emitting device package may include a first lower recess R11 and a second lower recess R12. The first lower recess R11 and the second lower recess R12 may be spaced apart from each other.

The first lower recess R11 may be provided in a lower surface of the first frame 111. The first lower recess R11 may be concavely provided from the lower surface toward an upper surface of the first frame 111. The first lower recess R11 may be spaced apart from the first opening part TH1.

The first lower recess R11 may have a width of several micrometers to several tens of micrometers. A resin part may be provided in the first lower recess R11. The resin part filled in the first lower recess R11 may be, for example, formed of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the first lower recess R11 may be provided in a process of forming the first frame 111, the second frame 112, and the body 113 through an injection molding process or the like.

The resin part filled in the first lower recess R11 may be disposed at a periphery of the lower surface region of the first frame 111 provided with the first opening part TH1. The lower surface region of the first frame 111 provided with the first opening part TH1 may have a shape in the form of an island and may be separated from the lower surface of the first frame 111 around the lower surface region.

For example, as described above with reference to FIG. 2, the lower surface region of the first frame 111 provided with the first opening part TH1 may be isolated from the first frame 111 around the lower surface region by the resin part filled in the first lower recess R11 and the body 113.

Therefore, if the resin part is formed of a material representing low adhesive strength and low wettability with the first and second conductive layers 321 and 322, or a material representing low surface tension between the resin part and the first and second conductive layers 321 and 322, the first conductive layer 321 provided in the first opening part TH1 can be prevented from being diffused over the resin part filled in the first lower recess R11 or the body 113 by overflowing from the first opening part TH1.

This is based on adhesion relation between the first conductive layer 321 and the resin part and between the first conductive layer 321 and the body 113, or the low wettability and low surface tension between the resin part and the first and second conductive layers 321 and 322. In other words, a material constituting the first conductive layer 321 may be selected to represent good adhesion with the first frame 111. In addition, the material constituting the first conductive layer 321 may be selected to represent low adhesion with the resin part and the body 113.

Accordingly, the first conductive layer 321 is prevented from flowing out or spreading to an outside of the region where the resin part or the body 113 is provided by flowing out from the first opening part TH1 toward a region where the resin part or the body 113 is provided, and the first conductive layer 321 can be stably disposed in a region where the first opening part TH1 is provided.

Therefore, if the first conductive layer 321 disposed in the first opening part TH1 flows out, the first conductive layer 321 can be prevented from expanding to an external region of the resin part or the first lower recess R11 provided with the body 113. In addition, the first conductive layer 321 can be stably connected to the lower surface of the first bonding part 121 in the first opening part TH1.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in a process of disposing the first and second conductive layers 321 and 322.

In addition, the second lower recess R12 may be provided in a lower surface of the second frame 112. The second lower recess R12 may be concavely provided from the lower surface toward an upper surface of the second frame 112. The second lower recess R12 may be spaced apart from the second opening part TH2.

The second lower recess R12 may have a width of several micrometers to several tens of micrometers. The resin part may be provided in the second lower recess R12. The resin part filled in the second lower recess R12 may be, for example, provided of a material same to a material of the body 113.

However, embodiments are not limited thereto, and the resin part may be formed of a material selected from materials representing low adhesive strength and low wettability with the first and second conductive layers 321 and 322. Alternatively, the resin part may be selected from materials representing low surface tension with the first and second conductive layers 321 and 322.

For example, the resin part filled in the second lower recess R12 may be provided in the process of forming the first frame 111, the second frame 112, and the body 113 through an injection molding process or the like.

The resin part filled in the second lower recess R12 may be disposed at a periphery of the lower surface region of the second frame 112 provided with the second opening part TH2. The lower surface region of the second frame 112 provided with the second opening part TH2 may have a shape in the form of an island and may be separated from the lower surface of the second frame 112 around the lower surface region.

For example, as described above with reference to FIG. 2, the lower surface region of the second frame 112 provided with the second opening part TH2 may be isolated from the second frame 112 around the lower surface region by the resin part filled in the second lower recess R12 and the body 113.

Therefore, if the resin part is formed of a material representing low adhesive strength and low wettability with the first and second conductive layers 321 and 322, or a material representing low surface tension between the resin part and the first and second conductive layers 321 and 322, the second conductive layer 322 provided in the second opening part TH2 can be prevented from being diffused over the resin part filled in the second lower recess R12 or the body 113 by overflowing from the second opening part TH2.

This is based on adhesion relation between the second conductive layer 322 and the resin part and between the second conductive layer 322 and the body 113, or the low wettability and low surface tension between the resin part and the first and second conductive layers 321 and 322. In other words, a material constituting the second conductive layer 322 may be selected to represent good adhesion with the second frame 112. In addition, the material constituting the second conductive layer 322 may be selected to represent low adhesion with the resin part and the body 113.

Accordingly, the second conductive layer 322 is prevented from flowing out or spreading to an outside of the region where the resin part or the body 113 is provided by flowing out from the second opening part TH2 toward a region where the resin part or the body 113 is provided, and the second conductive layer 322 can be stably disposed in a region where the second opening part TH2 is provided.

Therefore, if the second conductive layer 322 disposed in the second opening part TH2 flows out, the second conductive layer 322 can be prevented from expanding to an external region of the resin part or the second lower recess R12 provided with the body 113. In addition, the second conductive layer 322 can be stably connected to the lower surface of the second bonding part 122 in the second opening part TH2.

Therefore, when the light emitting device package is mounted on the circuit board, the first conductive layer 321 and the second conductive layer 322 can be prevented from being short-circuited by making contact with each other, and it can be remarkably easy to control an amount of the first and second conductive layers 321 and 322 in the process of disposing the first and second conductive layers 321 and 322.

According to the embodiment, as described above with reference to FIG. 9, in the process of mounting the package body 110 on the circuit board 410, a material constituting the first pad 411 or a bonding material provided on the first pad 411 may be prevented from being diffused and moved toward the first opening TH1 by a resin part provided in the first opening TH1.

In addition, according to the embodiment, in the process of mounting the package body 110 on the circuit board 410, a material constituting the second pad 412 or a bonding material provided on the second pad 412 may be prevented from being diffused and moved toward the second opening TH2 by a resin part provided in the second opening TH2.

In addition, according to the light emitting device package of the embodiment, as shown in FIG. 9, the first resin 130 provided in the recess R may be provided between the lower surface of the light emitting device 120 and the upper surface of the package body 110. When viewed from the top of the light emitting device 120, the first resin 130 may be provided around the first and second bonding parts 121 and 122. In addition, when viewed from the top of the light emitting device 120, the first resin 130 may be provided around the first and second openings TH1 and TH2.

The first resin 130 may function to stably fix the light emitting device 120 to the package body 110. In addition, the first resin 130 may be disposed around the first and second bonding parts 121 and 122 and in contact with side surfaces of the first and second bonding parts 121 and 122.

The first resin 130 can seal peripheries of the first bonding part 121 and the second bonding part 122. The resin 130 may prevent the first conductive layer 321 and the second conductive layer 322 from being diffused and moved by overflowing from regions of the first opening TH1 and the second opening TH2 outward of the light emitting device 120. When the first and second conductive layers 321 and 322 are diffused and moved outward of the light emitting device 120, a failure due to a short may be caused since the first and second conductive layers 321 and 322 may make contact with the active layer of the light emitting device 120. Accordingly, when the first resin 130 is disposed, the short caused by the first and second conductive layers 321 and 322 and the active layer may be prevented, thereby improving the reliability of the light emitting device package according to the embodiment.

In addition, the resin 130 may prevent the first conductive layer 321 and the second conductive layer 322 from being diffused and moved by overflowing from regions of the first opening TH1 and the second opening TH2 under the lower surface of the light emitting device 120 in the direction of the recess. Accordingly, the first conductive layer 321 and the second conductive layer 322 may be prevented from being electrically short-circuited under the light emitting device 120.

In the light emitting device package 100 according to an embodiment, a power source may be connected to the first bonding part 121 through a region of the first opening part TH1, and the power source may be connected to the second bonding part 122 through a region of the second opening part TH2.

Accordingly, the light emitting device 120 can be driven by a driving power supplied through the first bonding part 121 and the second bonding part 122. In addition, the light emitted from the light emitting device 120 may be directed in an upward direction of the package body 110.

In addition, the light emitting device package 100 according to the embodiment described above may be mounted and provided on a sub-mount, a circuit board or the like.

However, when a light emitting device package is conventionally mounted on a sub-mount, a circuit board or the like, a high temperature process such as a reflow process can be applied. At this time, in the reflow process, a re-melting phenomenon may occur in a bonding region between a lead frame and the light emitting device provided in the light emitting device package, thereby weakening stability of electrical connection and physical coupling.

However, in the light emitting device package and the method of manufacturing a light emitting device package according to an embodiment, a bonding part of the light emitting device may receive a driving power through a conductive layer disposed in an opening part. In addition, a melting point of the conductive layer disposed in the opening part may be selected to be a value higher than a melting point of a typical bonding material and a melting point of an IMC layer.

Therefore, according to an embodiment, even if the light emitting device package 100 is bonded to a main substrate and the like through the reflow process, the re-melting phenomenon may not occur, so that the electrical connection and physical bonding strength may not be deteriorated.

In addition, in a light emitting device package 100 and the method of manufacturing a light emitting device package according to an embodiment, the package body 110 does not need to be exposed at high temperatures in a process of manufacturing the light emitting device package. Therefore, according to an embodiment, it is possible to prevent the package body 110 from being exposed at high temperatures to be damaged or discolored.

Accordingly, materials constituting the body 113 can be variously selected. According to an embodiment, the body 113 may be formed of expensive materials such as ceramic, and relatively inexpensive resin materials.

For example, the body 113 may include at least one material selected from the group consisting of a PolyPhtalAmide (PPA) resin, a PolyCyclohexylenedimethylene Terephthalate (PCT) resin, an epoxy molding compound (EMC) resin, and a silicone molding compound (SMC) resin.

Next, a light emitting device package according to another embodiment will be described with reference to FIG. 11.

Figure 11:
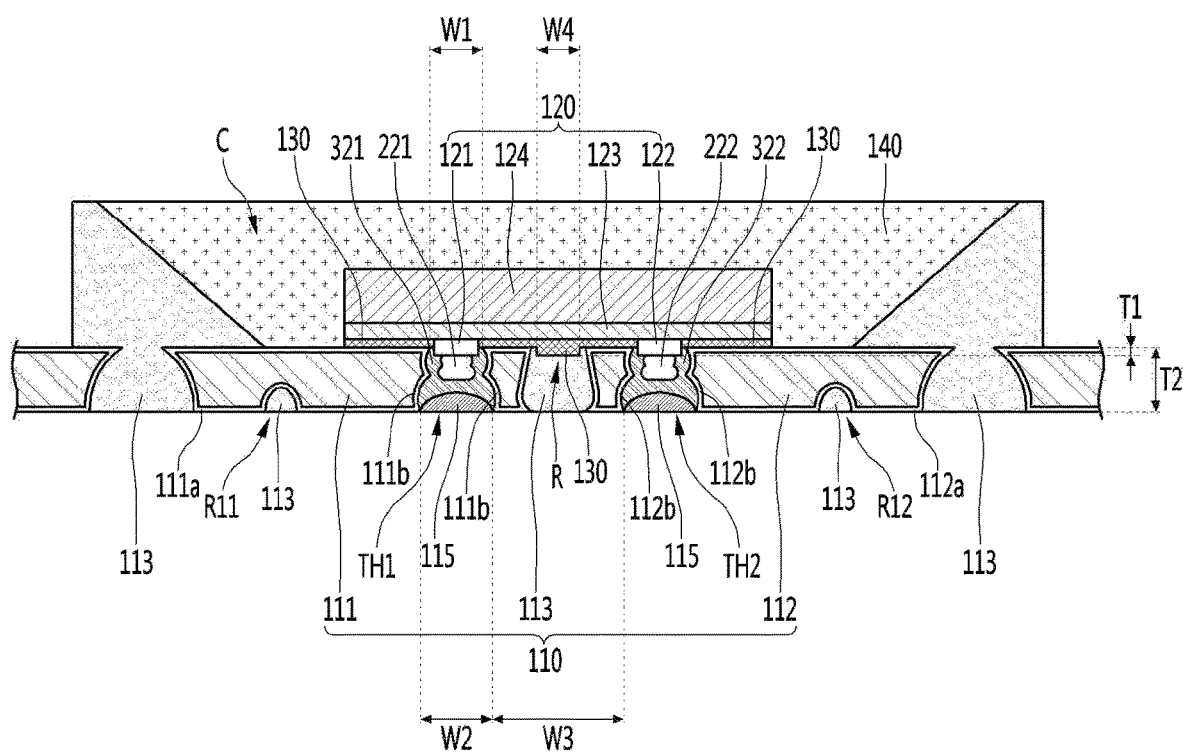
FIG. 11 is a view showing still another example of a light emitting device package according to an embodiment of the present invention.

FIG. 11 is a view showing a light emitting device package according to another embodiment of the present invention. While describing the light emitting device package according to an embodiment with reference to FIG. 11, the descriptions that overlap with those described with reference to FIGS. 1 to 10 may be omitted.

As shown in FIG. 11, the light emitting device package according to the embodiment may include a resin layer 115 disposed in the first and second openings TH1 and TH2. The resin layer 115 may be disposed under the first and second conductive layers 321 and 322.

The resin layer 115 may protect the first and second conductive layers 321 and 322. The resin layer 115 may seal the first and second openings TH1 and TH2. The resin layer 115 may prevent the first and second conductive layers 321 and 322 from being diffused and moved to lower portions of the first and second openings TH1 and TH2.

For example, the resin layer 115 may include a material similar to the body 113. The resin layer 115 may include at least one material selected from the group including polyphthalamide (PPA) resin, polycyclohexylenedimethylene terephthalate (PCT) resin, epoxy molding compound (EMC) resin and silicone molding compound (SMC) resin.

In addition, the resin layer 115 may include at least one of an epoxy-based material, a silicone-based material, and a hybrid material including the epoxy-based material and the silicon-based material.

In addition, the light emitting device package described above may be provided with a flip chip light emitting device as an example.

For example, the flip chip light emitting device may be provided as a reflective flip chip light emitting device that emits light in six-surfaced directions, or may be provided as a reflective flip chip light emitting device that emits light in five-surfaced directions.

The reflective flip chip light emitting device that emits light in the five-surfaced directions may have a structure in which a reflection layer is disposed in a direction close to the package package body 110. For example, the reflective flip chip light emitting device may include an insulating reflective layer (such as a distributed bragg reflector, and an omni directional reflector) and/or a conductive reflective layer (such as Ag, Al, Ni, and Au) between the first and second bonding part pads and a light emitting structure.

In addition, the flip chip light emitting device that emits the light in the six-surfaced directions may include a first bonding part electrically connected to the first conductive semiconductor layer and a second bonding part electrically connected to the second conductive semiconductor layer, and may be provided as a general horizontal type light emitting device in which light is emitted between the first bonding part and the second bonding part.

In addition, the flip chip light emitting device that emits light in the six-surfaced directions may be provided as a transmissive flip chip light emitting device including both a reflective region disposed therein with a reflective layer between the first and second bonding part pads, and a transmissive region that emits the light.

Herein, the transmissive flip chip light emitting device refers to a device that emits the light to six surfaces of an upper surface, four side surfaces, and a lower surface thereof. In addition, the reflective flip chip light emitting device refers to a device that emits the light to five surfaces of an upper surface and four side surfaces thereof.

Hereinafter, an example of the flip chip light emitting device applied to the light emitting device package according to the embodiment of the present invention will be described with reference to the accompanying drawings.

Figure 12:
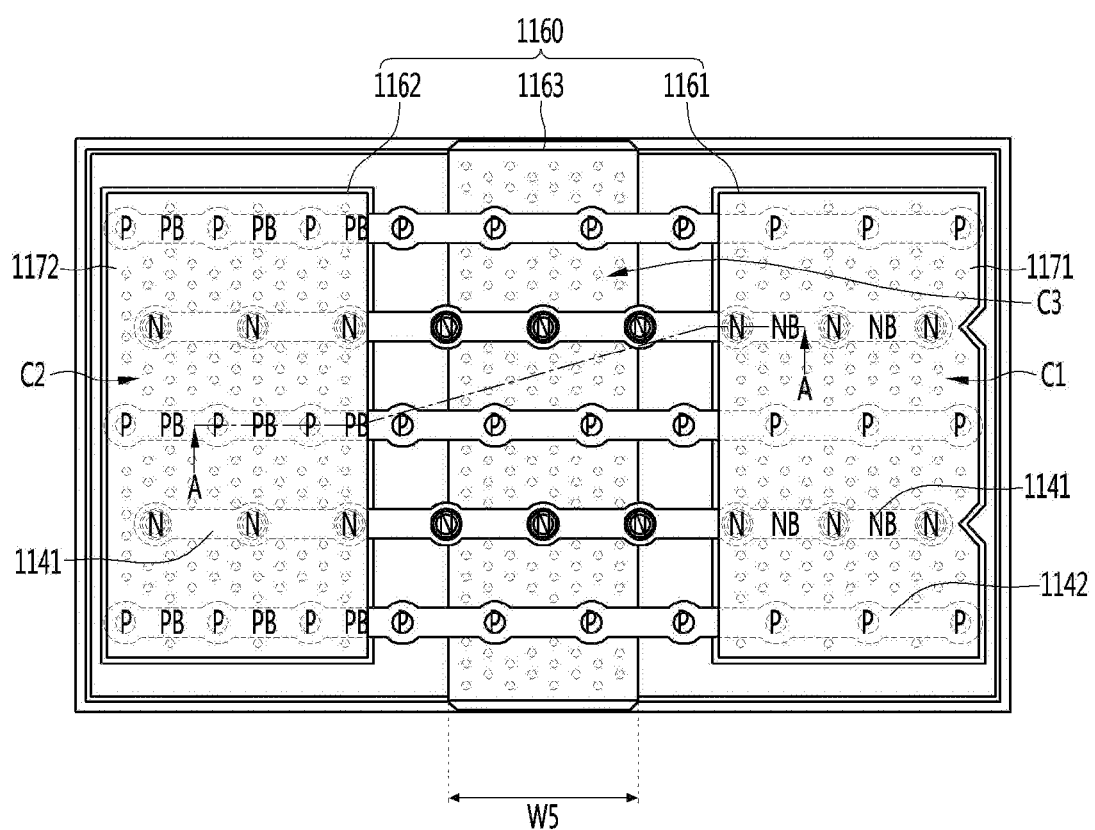
FIG. 12 is a plan view describing a light emitting device applied to a light emitting device package according to an embodiment of the present invention.
Figure 13:
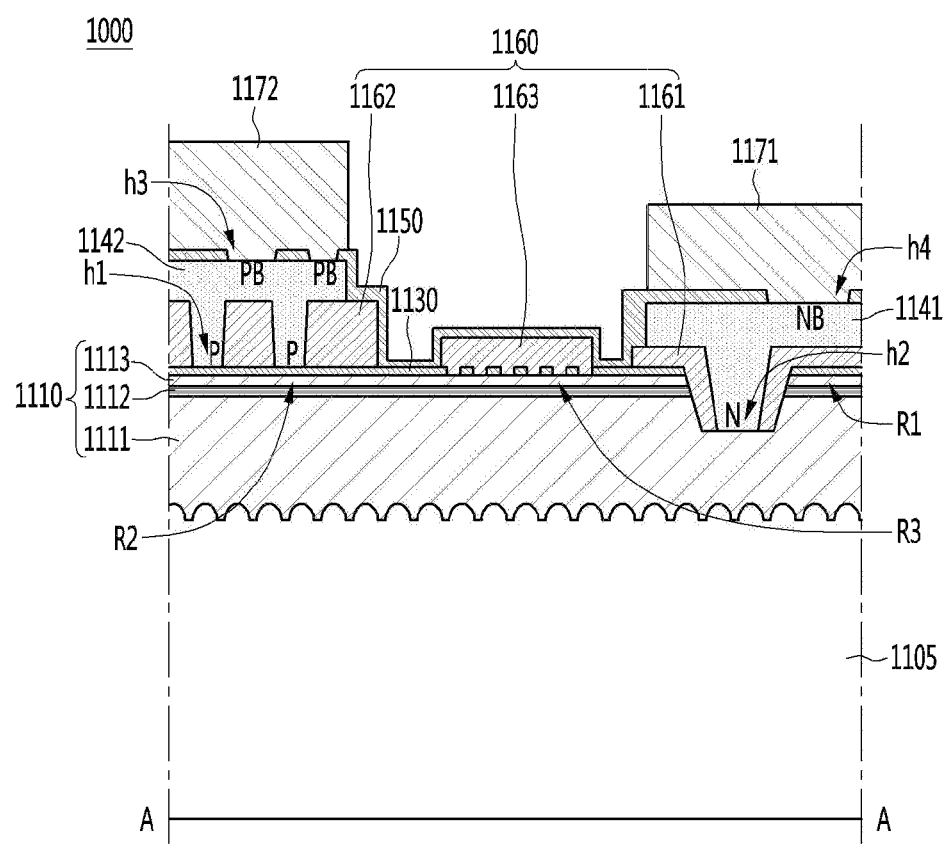
FIG. 13 is a sectional view taken along the line A-A of the light emitting device shown in FIG. 12.

FIG. 12 is a plan view illustrating a light emitting device according to an embodiment of the present invention, and FIG. 13 is a sectional view taken along the line A-A of a light emitting device shown in FIG. 12.

For better understanding, though disposed under the first bonding part 1171 and the second bonding part 1172, FIG. 12 shows a first sub-electrode 1141 electrically connected to the first bonding part 1171, and a second sub-electrode 1142 electrically connected to the second bonding part 1172.

As shown in FIGS. 12 and 13, the light emitting device 1100 according to the embodiment may include a light emitting structure 1110 disposed on a substrate 1105.

The substrate 1105 may be selected from the group including a sapphire substrate (Al2O3), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductive semiconductor layer 1111, an active layer 1112, and a second conductive semiconductor layer 1113. The active layer 1112 may be disposed between the first conductive semiconductor layer 1111 and the second conductive semiconductor layer 1113. For example, the active layer 1112 may be disposed on the first conductive semiconductor layer 1111, and the second conductive semiconductor layer 1113 may be disposed on the active layer 1112.

According to the embodiment, the first conductive semiconductor layer 1111 may be provided as an n-type semiconductor layer, and the second conductive semiconductor layer 1113 may be provided as a p-type semiconductor layer. According to another embodiment, the first conductive semiconductor layer 1111 may be provided as a p-type semiconductor layer, and the second conductive semiconductor layer 1113 may be provided as an n-type semiconductor layer.

Hereinafter, for the descriptive convenience, it will be described with reference to the situation that the first conductive semiconductor layer 1111 is provided as an n-type semiconductor layer and the second conductive semiconductor layer 1113 is provided as a p-type semiconductor layer.

As shown in FIG. 13, the light emitting device 1100 according to the embodiment may include a transparent electrode layer 1130. The transparent electrode layer 1130 may increase light output by improving a current diffusion.

For example, the transparent electrode layer 1130 may include at least one selected from the group including a metal, metal oxide, and metal nitride. The transparent electrode layer 1130 may include a light transmissive material.

The transparent electrode layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

As shown in FIGS. 12 and 13, the light emitting device 1100 according to the embodiment may include a reflective layer 1160. The reflective layer 1160 may include a first reflective layer 1161, a second reflective layer 1162, and a third reflective layer 1163. The reflective layer 1160 may be disposed on the transparent electrode layer 1130.

The second reflective layer 1162 may include a first opening h1 for exposing the transparent electrode layer 1130. The second reflective layer 1162 may include a plurality of first openings h1 disposed on the transparent electrode layer 1130.

The first reflective layer 1161 may include second openings h2 for exposing an upper surface of the first conductive semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

The reflective layer 1160 according to the embodiment may make contact with the second conductive semiconductor layer 1113 through contact holes provided in the transparent electrode layer 1130. The reflective layer 1160 may physically make contact with an upper surface of the second conductive semiconductor layer 1113 through the contact holes provided in the transparent electrode layer 1130.

The reflective layer 1160 may be provided as an insulating reflective layer. For example, the reflective layer 1160 may be provided as a distributed bragg reflector (DBR) layer. In addition, the reflective layer 1160 may be provided as an omni directional reflector (ODR) layer. In addition, the reflective layer 1160 may be provided by stacking the DBR layer and the ODR layer.

As shown in FIGS. 12 and 13, the light emitting device 1100 according to the embodiment may include the first sub-electrode 1141 and the second sub-electrode 1142.

The first sub-electrode 1141 may be electrically connected to the first conductive semiconductor layer 1111 in the second opening h2. The first sub-electrode 1141 may be disposed on the first conductive semiconductor layer 1111. For example, according to the light emitting device 1100 of the embodiment, the first sub-electrode 1141 may be disposed on the upper surface of the first conductive semiconductor layer 1111 in the recess provided to a partial region of the first conductive semiconductor layer 1111 through the second conductive semiconductor layer 1113 and the active layer 1112.

The first sub-electrode 1141 may be electrically connected to the upper surface of the first conductive semiconductor layer 1111 through the second opening h2 provided in the first reflective layer 1161. The second opening h2 and the recess may vertically overlap each other. For example, as shown in FIGS. 24 and 25, the first sub-electrode 1141 may make direct contact with the upper surface of the first conductive semiconductor layer 1111 in recess regions.

The second sub-electrode 1142 may be electrically connected to the second conductive semiconductor layer 1113. The second sub-electrode 1142 may be disposed on the second conductive semiconductor layer 1113. According to the embodiment, the transparent electrode layer 1130 may be disposed between the second sub-electrode 1142 and the second conductive semiconductor layer 1113.

The second sub-electrode 1142 may be electrically connected to the second conductive semiconductor layer 1113 through the first opening h1 provided in the second reflective layer 1162. For example, as shown in FIGS. 31 and 32, the second sub-electrode 1142 may be electrically connected to the second conductive semiconductor layer 1113 through the transparent electrode layer 1130 in P regions.

As shown in FIGS. 12 and 13, the second sub-electrode 1142 may make direct contact with an upper surface of the transparent electrode layer 1130 through a plurality of first openings h1 provided in the second reflective layer 1162 in the P regions.

According to the embodiment, as shown in FIGS. 12 and 13, the first sub-electrode 1141 and the second sub-electrode 1142 may have polarities to each other and may be spaced apart from each other.

For example, the first sub-electrode 1141 may be provided in line shapes. In addition, for example, the second sub-electrode 1142 may be provided in line shapes. The first sub-electrode 1141 may be disposed between neighboring second sub-electrodes 1142. The second sub-electrode 1142 may be disposed between neighboring first sub-electrodes 1141.

When the first sub-electrode 1141 and the second sub-electrode 1142 have polarities different from each other, the number of the electrodes may be different from each other. For example, when the first sub-electrode 1141 is configured to be an n-electrode and the second sub-electrode 1142 be a p-electrode, the number of the second sub-electrodes 1142 may be more. When an electrical conductivity and/or resistance of the second conductive semiconductor layer 1113 and the first conductive semiconductor layer 1111 are different from each other, electrons injected into the light emitting structure 1110 may be balanced with positive holes by the first sub-electrode 1141 and the second sub electrode 1142, thus optical characteristics of the light emitting device may be improved.

In addition, polarities of a first sub-electrode 1141 and a second sub-electrode 1142 may be opposite to each other depending on characteristics required in the light emitting device package to which the light emitting device according to the embodiment is applied. In addition, the width, length, shape, and number of the first sub-electrode 1141 and the second sub-electrode 1142 may be variously modified according to the characteristics required in the light emitting device package.

The first sub-electrode 1141 and the second sub-electrode 1142 may be provided with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

As shown in FIGS. 12 and 13, the light emitting device 1100 according to the embodiment may include a protective layer 1150.

The protective layer 1150 may include third openings h3 for exposing the second sub-electrode 1142. The third openings h3 may be disposed corresponding to PB regions provided in the second sub-electrode 1142.

In addition, the protective layer 1150 may include fourth openings h4 for exposing the first sub-electrode 1141. The fourth openings h4 may be disposed corresponding to NB regions provided in the first sub-electrode 1141.

The protective layer 1150 may be disposed on the reflective layer 1160. The protective layer 1150 may be disposed on the first reflective layer 1161, the second reflective layer 1162, and the third reflective layer 1163.

For example, the protective layer 1150 may be provided as an insulating material. For example, the protective layer 1150 may be formed of at least one material selected from the group including SixOy, SiOxNy, SixNy, and AlxOy.

As shown in FIGS. 12 and 13, the light emitting device 1100 according to the embodiment may include the first bonding part 1171 and the second bonding part 1172 disposed on the protective layer 1150.

The first bonding part 1171 may be disposed on the first reflective layer 1161. In addition, the second bonding part 1172 may be disposed on the second reflective layer 1162. The second bonding part 1172 may be spaced apart from the first bonding part 1171.

The first bonding part 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first bonding part 1171 may be uniformly distributed in a horizontal direction of the first sub-electrode 1141, thus the current may be uniformly injected in the NB regions.

In addition, the second bonding part 1172 may make contact with an upper surface of the second sub-electrode 1142 through the third openings h3 provided in the protective layer 1150 in the PB regions. When the PB regions and the first openings ht are not vertically overlapped with each other, a current injected into the second bonding part 1172 may be uniformly distributed in a horizontal direction of the second sub-electrode 1142, thus the current may be uniformly injected in the PB regions.

Thus, according to the light emitting device 1100 of the embodiment, the first bonding part 1171 may make contact with the first sub-electrode 1141 in the fourth openings h4. In addition, the second bonding part 1172 may make contact with the second sub-electrode 1142 in the multiple regions. Thus, according to the embodiment, because the power may be supplied through the regions, a current dispersion effect can be generated and an operating voltage can be reduced according to the increase of a contact area and the dispersion of a contact region.

In addition, according to the light emitting device 1100 of the embodiment, as shown in FIG. 13, the first reflective layer 1161 is disposed under the first sub-electrode 1141 and the second reflective layer 1162 is disposed under the second sub-electrode 1142. Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved.

For example, the first reflective layer 1161 and the second reflective layer 1162 may be formed of an insulating material, and have a structure such as a DBR structure using a material having high reflectivity to reflect the light emitted from the active layer 1112.

The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of $TiO_2$, $SiO_2$, $Ta_2O_5$, and $HfO_2$.

Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112.

In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the first bonding part 1171 and the second bonding part 1172 are not provided among surfaces on which the first bonding part 1171 and the second bonding part 1172 are disposed.

Specifically, the light emitted from the light emitting structure 1110 may be emitted to the outside through a region where the third reflective layer 1163 is not provided among the surfaces on which the first bonding part 1171 and the second bonding part 1172 are disposed.

Accordingly, the light emitting device 1100 according to the embodiment may emit the light in six-surfaced directions surrounding the light emitting structure 1110, and remarkably improve the light intensity.

In addition, according to the light emitting device of the embodiment, when viewed from the top of the light emitting device 1100, the sum of the areas of the first bonding part 1171 and the second bonding part 1172 is less than or equal to 60% of the total area of the upper surface of the light emitting device 1100 on which the first bonding part 1171 and the second bonding part 1172 are disposed.

For example, the total area of the upper surface of the light emitting device 1100 may correspond to the area defined by a lateral length and a longitudinal length of the lower surface of the first conductive semiconductor layer 1111 of the light emitting structure 1110. In addition, the total area of the upper surface of the light emitting device 1100 may correspond to the area of an upper surface or a lower surface of the substrate 1105.

Accordingly, the sum of the areas of the first bonding part 1171 and the second bonding part 1172 is equal to or less than 60% of the total area of the light emitting device 1100, so that the amount of light emitted to the surface on which the first bonding part 1171 and the second bonding part 1172 are disposed may be increased. Thus, according to the embodiment, because the amount of the light emitted in the six-surfaced directions of the light emitting device 1100 is increased, the light extraction efficiency may be improved and the light intensity Po may be increased.

In addition, when viewed from the top of the light emitting device, the sum of the areas of the first bonding part 1171 and the second bonding part 1172 is equal to or greater than 30% of the total area of the light emitting device 1100.

Accordingly, the sum of the areas of the first bonding part 1171 and the second bonding part 1172 is equal to or greater than 30% of the total area of the light emitting device 1100, so that a stable mount may be performed through the first bonding part 1171 and the second bonding part 1172, and electrical characteristics of the light emitting device 1100 may be ensured.

The sum of the areas of the first bonding part 1171 and the second bonding part 1172 may be selected as 30% to 60% with respect to the total area of the light emitting device 1100 in consideration of ensuring the light extraction efficiency and the bonding stability.

In other words, when the sum of the areas of the first bonding part 1171 and the second bonding part 1172 is 30% to 100% with respect to the total area of the light emitting device 1100, the electrical characteristics of the light emitting device 1100 may be ensured and bonding strength to be mounted on the light emitting device package may be ensured, so that stable mount may be performed.

In addition, when the sum of the areas of the first bonding part 1171 and the second bonding part 1172 is more than 0% and equal to or less than 60% of the total area of the light emitting device 1100, the amount of light emitted to the surface on which the first bonding part 1171 and the second bonding part 1172 are disposed increases, so that the light extraction efficiency of the light emitting device 1100 may be improved and the light intensity Po may be increased.

In the embodiment, the sum of the areas of the first bonding part 1171 and the second bonding part 1172 is selected as 30% to 60% of the total area of the light emitting device 1100 to ensure the electrical characteristics of the light emitting device 1100 and the bonding strength to be mounted on the light emitting device package and increase the light intensity.

In addition, according to the light emitting device 1100 of the embodiment, the third reflective layer 1163 may be disposed between the first bonding part 1171 and the second bonding part 1172. For example, the length W5 of the third reflective layer 1163 in major axial direction of the light emitting device 1100 may correspond to the distance between the first bonding part 1171 and the second bonding part 1172. In addition, for example, the area of the third reflective layer 1163 may be 10% to 25% of the entire upper surface of the light emitting device 1100.

When the area of the third reflective layer 1163 is 10% or more of the entire upper surface of the light emitting device 1100, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1100 to ensure the light extraction efficiency more, and the area of the third reflective layer 1163 may be arranged to more than 25% and less than 100% of the entire upper surface of the light emitting device 1100 to prevent the package body from being discolored or cracked.

In addition, the light generated from the light emitting structure 1110 may be transmitted and emitted through a second region provided between a side surface arranged in the major axial direction and the first bonding part 1171 or the second bonding part 1172 adjacent to the side surface.

In addition, the light generated from the light emitting structure 1110 may be transmitted and emitted through a third region provided between a side surface arranged in a minor axial direction and the first bonding part 1171 or the second bonding part 1172 adjacent to the side surface.

According to the embodiment, the size of the first reflective layer 1161 may be several micrometers larger than the size of the first bonding part 1171. For example, the area of the first reflective layer 1161 may be provided in a size to completely cover the area of the first bonding part 1171. In consideration of a process error, for example, the length of one side of the first reflective layer 1161 may be greater than the length of one side of the first bonding part 1171 by about 4 micrometers to about 10 micrometers.

In addition, the size of the second reflective layer 1162 may be several micrometers larger than the size of the second bonding part 1172. For example, the area of the second reflective layer 1162 may be provided in a size to completely cover the area of the second bonding part 1172. In consideration of a process error, for example, the length of one side of the second reflective layer 1162 may be greater than the length of one side of the second bonding part 1172 by about 4 micrometers to about 10 micrometers.

According to the embodiment, light emitted from the light emitting structure 1110 may be reflected without being incident on the first bonding part 1171 and the second bonding part 1172 by the first reflective layer 1161 and the second reflective layer 1162. Thus, according to the embodiment, a loss of the light generated and emitted from the light emitting structure 1110 and incident to the first bonding part 1171 and the second bonding part 1172 may be minimized.

In addition, according to the light emitting device 1100 of the embodiment, because the third reflective layer 1163 is disposed between the first bonding part 1171 and the second bonding part 1172, the amount of light emitted between the first bonding part 1171 and the second bonding part 1172 may be adjusted.

As described above, the light emitting device 1100 according to the embodiment may be provided as a light emitting device package after being mounted, for example, in a flip chip bonding scheme. Herein, when the package body mounted thereon with the light emitting device 1100 is provided with resin or the like, the package body is discolored or cracked in the lower region of the light emitting device 1100 due to strong short-wavelength light emitted from the light emitting device 1100.

However, according to the light emitting device 1100 of the embodiment, because the amount of light emitted between the region on which the first bonding part 1171 and the second bonding part 1172 are disposed is adjusted, the package body disposed in the lower region of the light emitting device 1100 may be prevented from being discolored or cracked.

According to the embodiment, the light generated from the light emitting structure 1100 may be transmitted and emitted through 20% or more of the area of the upper surface of the light emitting device 1100 on which the first bonding part 1171, the second bonding part 1172 and the third reflective layer 1163.

Thus, according to the embodiment, because the amount of the light emitted in the six-surfaced directions of the light emitting device 1100 is increased, the light extraction efficiency may be improved and the light intensity Po may be increased. In addition, the package body disposed adjacent to the lower surface of the light emitting device 1100 may be prevented from being discolored or cracked.

In addition, according to the light emitting device 1100 of the embodiment, a plurality of contact holes C1, C2, and C3 may be provided in the transparent electrode layer 1130. The second conductive semiconductor layer 1113 may be bonded to the reflective layer 1160 through the plurality of contact holes C1, C2, and C3 provided in the transparent electrode layer 1130. The reflective layer 1160 makes directly contact with the second conductive semiconductor layer 1113, so that the adhesive strength may be improved as compared with the situation that the reflective layer 1160 makes contact with the transparent electrode layer 1130.

When the reflective layer 1160 makes direct contact with only the transparent electrode layer 1130, the bonding strength or adhesive strength between the reflective layer 1160 and the transparent electrode layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the transparent electrode layer 1130 is weak, peeling may incur between the two layers. Thus, when the peeling incurs between the reflective layer 1160 and the transparent electrode layer 1130, the characteristics of the light emitting device 1100 may deteriorate and the reliability of the light emitting device 1100 may not be ensured.

However, according to the embodiment, because the reflective layer 1160 can make direct contact with the second conductive semiconductor layer 1113, the bonding strength and adhesive strength may be stably provided between the reflective layer 1160, the transparent electrode layer 1130, and the second conductive semiconductor layer 1113.

Thus, according to the embodiment, because the bonding strength between the reflective layer 1160 and the second conductive semiconductor layer 1113 may be stably provided, the reflective layer 1160 may be prevented from being peeled off from the transparent electrode layer 1130. In addition, because the bonding strength between the reflective layer 1160 and the second conductive semiconductor layer 1113 may be stably provided, the reliability of the light emitting device 1100 may be improved.

In addition, as described above, the transparent electrode layer 1130 may be provided with the contact holes C1, C2, and C3. The light emitted from the active layer 1112 may be incident to and reflected by the reflective layer 1160 through the contact holes C1, C2, and C3 provided in the transparent electrode layer 1130. Accordingly, the loss of the light generated from the active layer 1112 and incident to the transparent electrode layer 1130 is reduced, so that the light extraction efficiency may be improved. Thus, according to the light emitting device 1100 of the embodiment, the light intensity may be improved.

Hereinafter, an example of the flip chip light emitting device applied to the light emitting device package according to the embodiment of the present invention will be described with reference to FIG. 14 and FIG. 15.

Figure 14:
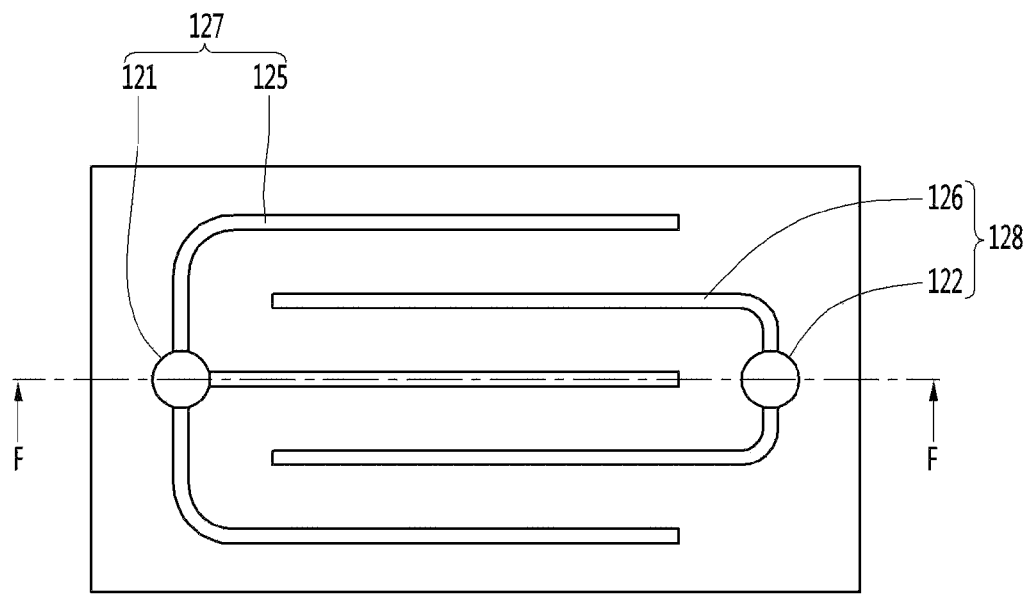
FIG. 14 is a plan view describing another example of a light emitting device applied to a light emitting device package according to an embodiment of the present invention.
Figure 15:
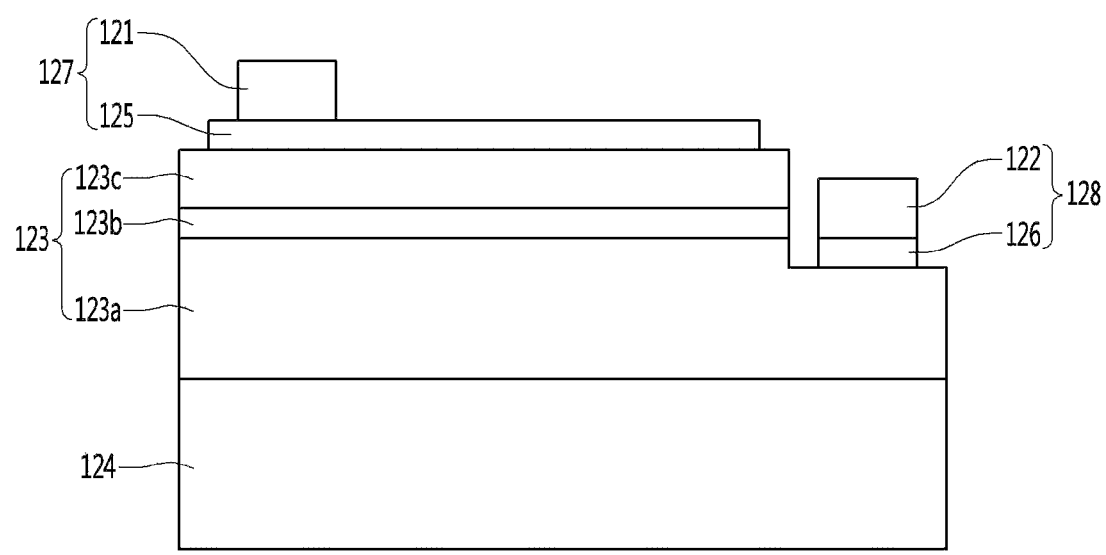
FIG. 15 is a sectional view taken along the line F-F of a light emitting device shown in FIG. 14.

FIG. 14 is a plan view describing an electrode arrangement of the light emitting device applied to the light emitting device package according to the embodiment of the present invention, and FIG. 15 is a sectional view taken along the line F-F of the light emitting device shown in FIG. 14.

In addition, for better understanding, FIG. 14 conceptually shows only the relative arrangement of the first electrode 127 and the second electrode 128. The first electrode 127 may include the first bonding part 121 and a first branched electrode 125. The second electrode 128 may include the second bonding part 122 and a second branched electrode 126.

As shown in FIGS. 14 and 15, the light emitting device according to the embodiment may include a light emitting structure 123 disposed on the substrate 124.

The substrate 124 may be selected from the group including a sapphire substrate ($Al_2O_3$), SiC, GaAs, GaN, ZnO, Si, GaP, InP and Ge. For example, the substrate 124 may be provided as a patterned sapphire substrate (PSS) formed on an upper surface thereof with a concavo-convex pattern.

The light emitting structure 123 may include a first conductive semiconductor layer 123aa, an active layer 123b, and a second conductive semiconductor layer 123c. The active layer 123b may be disposed between the first conductive semiconductor layer 123a and the second conductive semiconductor layer 123c. For example, the active layer 123b may be disposed on the first conductive semiconductor layer 123a, and the second conductive semiconductor layer 123c may be disposed on the active layer 123b.

According to the embodiment, the first conductive semiconductor layer 123a may be provided as an n-type semiconductor layer, and the second conductive semiconductor layer 123c may be provided as a p-type semiconductor layer.

According to another embodiment, the first conductive semiconductor layer 123a may be provided as a p-type semiconductor layer, and the second conductive semiconductor layer 123c may be provided as an n-type semiconductor layer.

As shown in FIGS. 14 and 15, the light emitting device according to the embodiment may include the first electrode 127 and the second electrode 128.

The first electrode 127 may include the first bonding part 121 and a first branched electrode 125. The first electrode 127 may be electrically connected to the second conductive semiconductor layer 123c. The first branched electrode 125 may be branched from the first bonding part 121. The first branched electrode 125 may include a plurality of branched electrodes branched from the first bonding part 121.

The second electrode 128 may include the second bonding part 122 and a second branched electrode 126. The second electrode 128 may be electrically connected to the first conductive semiconductor layer 123a. The second branched electrode 126 may be branched from the second bonding part 122. The second branched electrode 126 may include a plurality of branched electrodes branched from the second bonding part 122.

The first branched electrode 125 and the second branched electrode 126 may be alternately arranged to each other in a finger shape. The power supplied through the first bonding part 121 and the second bonding part 122 may spread to the entire light emitting structure 123 by the first branched electrode 125 and the second branched electrode 126.

The first electrode 127 and the second electrode 128 may have a single-layer or multi-layer structure. For example, the first electrode 127 and the second electrode 128 may be ohmic electrodes. For example, the first electrode 127 and the second electrode 128 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

In addition, the light emitting structure 123 may further include a protective layer. The protective layer may be provided on an upper surface of the light emitting structure 123. In addition, the protective layer may be provided on a side surface of the light emitting structure 123. The protective layer may be provided to exposure the first bonding part 121 and the second bonding part 122. In addition, the protective layer may be selectively provided on a periphery and a lower surface of the substrate 124.

For example, the protective layer may be provided as an insulating material. For example, the protective layer may be formed of at least one material selected from the group including $Si_xO_y$, $SiO_xN_y$, $Si_xN_y$, and $Al_xO_y$.

In the light emitting device according to the embodiment, light generated in the active layer 123b may be emitted in six-surfaced directions of the light emitting device. The light generated in the active layer 123b may be emitted in six-surfaced directions through an upper surface, a lower surface, and four side surfaces of the light emitting device.

For reference, the vertical direction of the light emitting device described with reference to FIGS. 1 to 11 and the vertical direction of the light emitting device shown in FIGS. 14 and 15 are shown opposite to each other.

According to the embodiment, the sum of the areas of the first and second bonding parts 121 and 122 may be 10% or less based on the area of the upper surface of the substrate 124. According to the light emitting device package of the embodiment, the sum of the areas of the first and second bonding parts 121 and 122 may be 10% or less based on the area of the substrate 124 to increase the light extraction efficiency by ensuring the light emitting area from the light emitting device.

In addition, according to the embodiment, the sum of the areas of the first and second bonding parts 121 and 122 may be 0.7% or more based on the area of the upper surface of the substrate 124. According to the light emitting device package of the embodiment, the sum of the areas of the first and second bonding parts 121 and 122 may be 0.7% or more based on the area of the upper surface of the substrate 124.

For example, the width of the first bonding part 121 in a long axis direction of the light emitting device may be tens of micrometers. The width of the first bonding part 121 may be in the range of 70 micrometers to 90 micrometers. In addition, the area of the first bonding part 121 may be thousands of square micrometers.

In addition, the width of the second bonding part 122 in the long axis direction of the light emitting device may be tens of micrometers. The width of the second bonding part 122 may be in the range of 70 micrometers to 90 micrometers. In addition, the area of the second bonding part 122 may be thousands of square micrometers.

Accordingly, when the area of the first and second bonding parts 121 and 122 is reduced, the amount of light transmitted to the lower surface of the light emitting device 120 may be increased.

Figure 16:
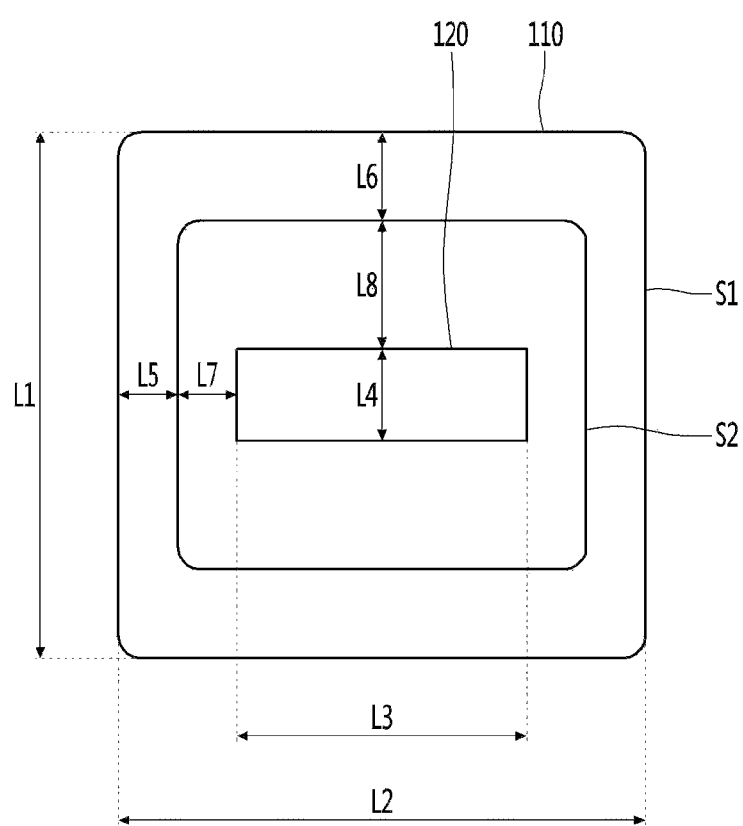
FIG. 16 is a view showing still another example of a light emitting device package according to an embodiment of the present invention.

In addition, FIG. 16 is a view illustrating another example of the light emitting device package according to the embodiment of the present invention.

As shown in FIG. 16, the light emitting device package according to the embodiment may include the package body 110 and the light emitting device 120. The package body 110 may include a cavity. The light emitting device 120 may be disposed in the cavity.

For example, the light emitting device 120 may be one of the light emitting devices described with reference to FIGS. 1 to 15. As described with reference to FIGS. 1 to 15, the light emitting device 120 may include first and second bonding parts 121 and 122. In addition, the first and second openings TH1 and TH2 and the body 113 including the recess R are provided under the light emitting device 120. Accordingly, the length L3 of the light emitting device 120 in the long axis direction may be approximately 1000 micrometers or more. The length L4 in the short axis direction of the light emitting device 120 may be shorter than the length L3 in the long axis direction, and when view from the top of the package body 110, the light emitting device 120 may be provided in a rectangular shape S1.

When view from the top of the package body 110, the package body 110 may be provided in a square shape including a first outer side having a first length L1 and arranged in parallel to the long axis direction of the light emitting device 120, and a second outer side having a second length L2 and arranged in parallel to the short axis direction of the light emitting device 120. The first length L1 and the second length L2 may be same with each other.

When view from the top of the package body 110, a bottom surface of the cavity may be provided in a rectangular shape S2 around the light emitting device 120.

According to the embodiment, the thickness L5 of a first sidewall of the package body 110 disposed perpendicularly to the long axis direction of the light emitting device 120 may be smaller than the thickness L6 of a second sidewall of the package body 110 disposed perpendicularly to the short axis direction of the light emitting device 120.

In addition, the length L7 between the light emitting device 120 and the first sidewall along the long axis direction of the light emitting device 120 may be shorter than the length L8 between the light emitting device 120 and the second sidewall along the short axis direction of the light emitting device 120.

For example, the length L7 between the light emitting device 120 and the first sidewall may be tens of micrometers to hundreds of micrometers. The length L7 between the light emitting device 120 and the first sidewall may be 90 micrometers or more, so that the light emitted from the light emitting device 120 can be reflected on the first sidewall to be efficiently extracted upward.

In addition, the length L8 between the light emitting device 120 and the second sidewall may be hundreds of micrometers. The length L7 between the light emitting device 120 and the first sidewall may be 200 micrometers or more, so that the light emitted from the light emitting device 120 can be reflected on the second sidewall to be efficiently extracted upward.

The light emitting device package according to the embodiment includes a rectangular small package body 110. When the light emitting device 120 having a length longer than 1000 micrometers in the long axis direction is disposed, the thickness of the first sidewall and the thickness of the second sidewall are different from each other, so that the light emitted from the light emitting device 120 can be efficiently extracted upward.

Figure 17:
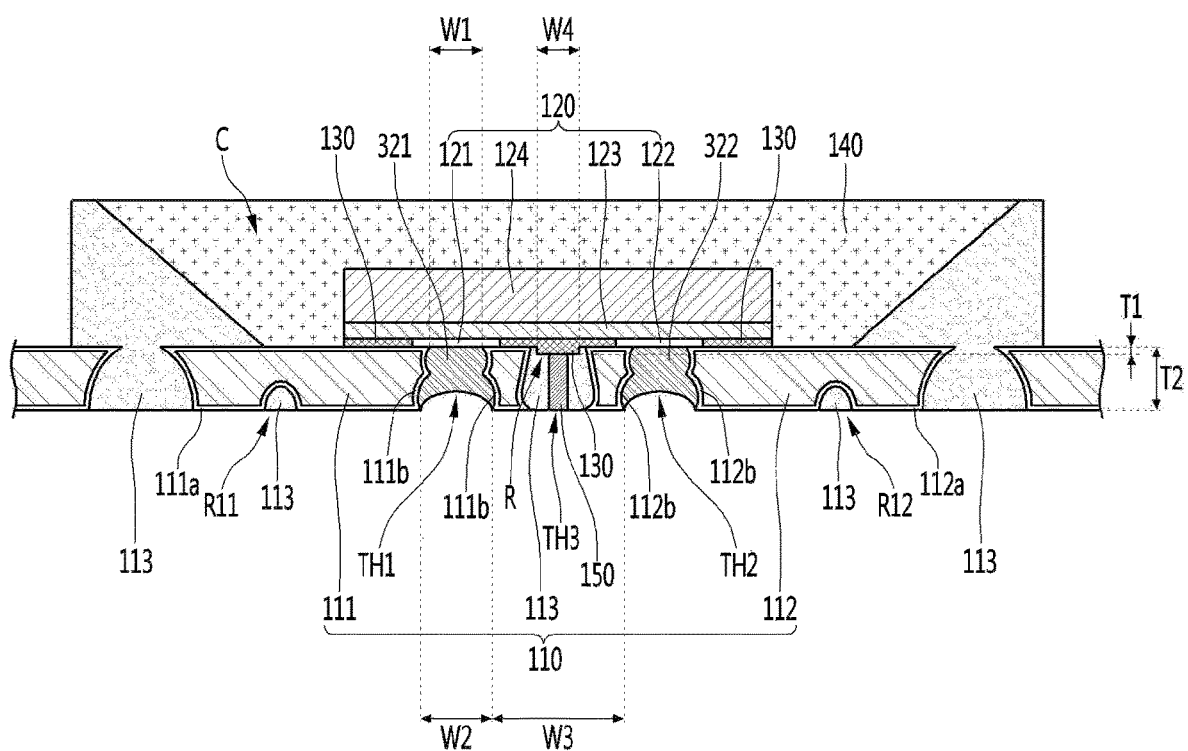
FIG. 17 is a view showing still another example of a light emitting device package according to an embodiment of the present invention.

In addition, FIG. 17 is a view illustrating another example of the light emitting device package according to the embodiment of the present invention. Upon description of the light emitting device package according to the embodiment with reference to FIG. 17, description overlapped with those described with reference to FIGS. 1 to 16 may be omitted.

The light emitting device package according to the embodiment shown in FIG. 17 may further include a heat dissipating member 150 as compared with the light emitting device package according to the embodiment shown in FIG. 3.

The heat dissipating member 150 may be disposed on a third opening TH3 provided in the body 113 and may be disposed under the recess R. The heat dissipating member 130 may be disposed between the first frame 111 and the second frame 112.

For example, the heat dissipating member 150 may include at least one of an epoxy-based material, a silicone-based material, and a hybrid material including the epoxy-based material and the silicon-based material. In addition, for example, when the dissipating member 130 includes a reflection function, the dissipating member 130 may include white silicone. In addition, the heat dissipating member 130 may include a material selected from the group including $Al_2O_3$, AlN, and the like having good thermal conductivity.

According to the embodiment, when the heat dissipating member 150 includes a material having good thermal conductivity, heat generated from the light emitting device 120 may be effectively dissipated. Accordingly, because the heat dissipation of the light emitting device 120 is effectively performed, the light extraction efficiency of the light emitting device 120 can be improved.

In addition, when the heat dissipating member 150 includes a reflective material, a light diffusion function may be provided between the light emitting device 120 and the body 113 with respect to light emitted to the lower surface of the light emitting device 120. When the light is emitted from the light emitting device 120 to the lower surface of the light emitting device 120, the heat dissipating member 130 provides the light diffusion function, so that the light extraction efficiency of the light emitting device package can be improved.

According to the embodiment, the heat dissipating member 150 may reflect the light emitted from the light emitting device 120. When the heat dissipating member 150 includes the reflection function, the heat dissipating member 130 may be formed of a material including $TiO_2$, $SiO_2$, and the like.

Figure 18:
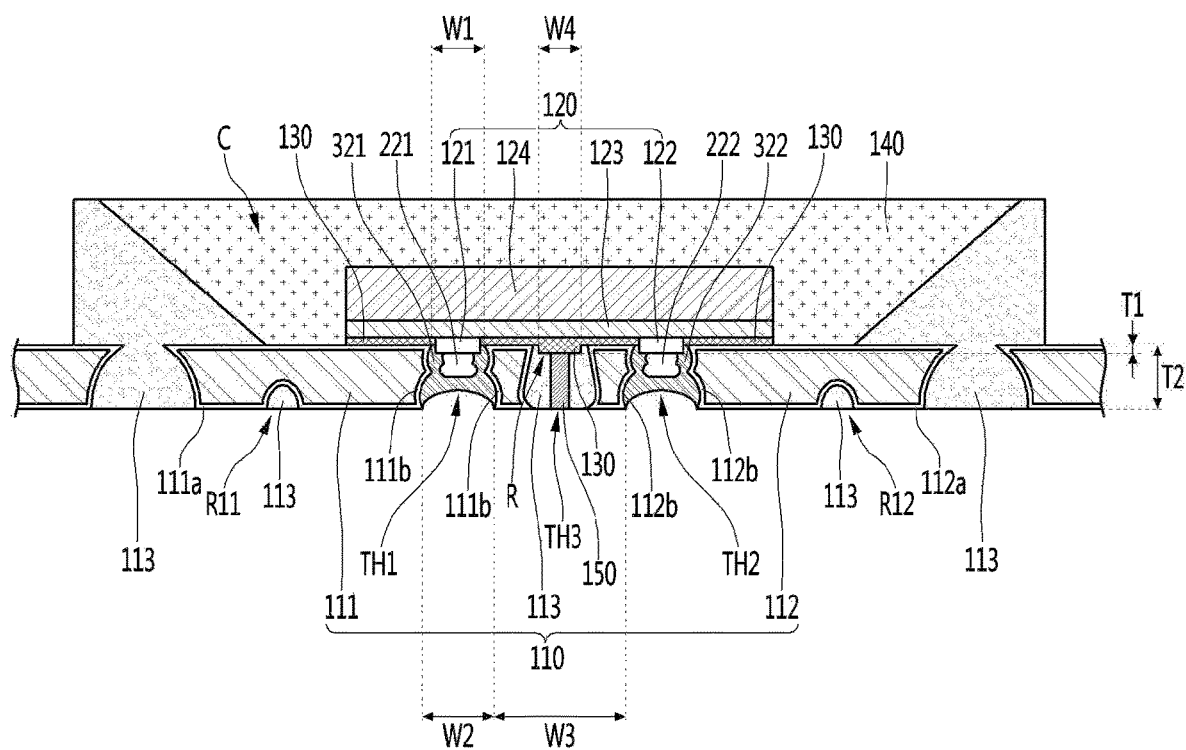
FIG. 18 is a view showing still another example of a light emitting device package according to an embodiment of the present invention.

In addition, FIG. 18 is a view illustrating another example of the light emitting device package according to the embodiment of the present invention. Upon description of the light emitting device package according to the embodiment with reference to FIG. 18, description overlapped with those described with reference to FIGS. 1 to 17 may be omitted.

The light emitting device package according to the embodiment shown in FIG. 18 may further include a heat dissipating member 150 as compared with the light emitting device package according to the embodiment shown in FIG. 10.

The heat dissipating member 150 may be disposed on a third opening TH3 provided in the body 113 and may be disposed under the recess R. The heat dissipating member 130 may be disposed between the first frame 111 and the second frame 112.

For example, the heat dissipating member 150 may include at least one of an epoxy-based material, a silicone-based material, and a hybrid material including the epoxy-based material and the silicon-based material. In addition, for example, when the dissipating member 130 includes a reflection function, the dissipating member 130 may include white silicone. In addition, the heat dissipating member 130 may include a material selected from the group including $Al_2O_3$, AlN, and the like having good thermal conductivity.

According to the embodiment, when the heat dissipating member 150 includes a material having good thermal conductivity, heat generated from the light emitting device 120 may be effectively dissipated. Accordingly, because the heat dissipation of the light emitting device 120 is effectively performed, the light extraction efficiency of the light emitting device 120 can be improved.

In addition, when the heat dissipating member 150 includes a reflective material, a light diffusion function may be provided between the light emitting device 120 and the body 113 with respect to light emitted to the lower surface of the light emitting device 120. When the light is emitted from the light emitting device 120 to the lower surface of the light emitting device 120, the heat dissipating member 130 provides the light diffusion function, so that the light extraction efficiency of the light emitting device package can be improved.

According to the embodiment, the heat dissipating member 150 may reflect the light emitted from the light emitting device 120. When the heat dissipating member 150 includes the reflection function, the heat dissipating member 130 may be formed of a material including $TiO_2$, $SiO_2$, and the like.

The light emitting device package according to the embodiment may be applied to the light source apparatus.

Further, the light source apparatus may include a display apparatus, a lighting apparatus, a head lamp, and the like based on the industrial field.

As an example of the light source apparatus, the display apparatus includes a bottom cover, a reflective plate disposed on the bottom cover, a light emitting module emitting light and including a light emitting device, a light guide plate disposed on a front of the reflective plate and guiding light emitted from the light emitting module, an optical sheet including prism sheets disposed in front of the light guide plate, a display panel disposed in front of the optical sheet, an image signal output circuit connected to the display panel and supplying an image signal to the display panel, and a color filter disposed in front of the display panel. Herein, the bottom cover, the reflective plate, the light emitting module, the light guide plate, and the optical sheet may form a backlight unit. In addition, the display apparatus may have a structure in which light emitting devices each emitting red, green, and blue light are disposed without including the color filter.

As another example of the light source apparatus, the head lamp may include a light emitting module including a light emitting device package disposed on a substrate, a reflector for reflecting light emitted from the light emitting module in a predetermined direction, for example, in a forward direction, a lens for forwardly refracting the light, and a shade for blocking or reflecting a portion of the light reflected by the reflector and directed to the lens to form a light distribution pattern desired by a designer.

The lighting apparatus as another light source apparatus may include a cover, a light source module, a heat sink, a power supply, an inner case, and a socket. In addition, the light source apparatus according to an embodiment may further include at least one of a member and a holder. The light source module may include a light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by anyone having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

The invention claimed is:

1. A light emitting device package comprising:
first and second frames spaced apart from each other;
a package body including a body portion disposed between the first and second frames;
a light emitting device including first and second electrode pads;
a first through hole in the first frame;
a second through hole in the second frame;
a conductive material disposed in the first and second through holes;
a first conductor disposed in the first though hole and electrically connected with the first electrode pad;
a second conductor disposed in the second though hole and electrically connected with the second electrode pad;
an intermetallic compound layer disposed between the conductive material and the first frame, and between the conductive material and the second frame;
a first resin disposed between the body portion of the package body and the light emitting device; and
a first recess disposed between the body portion of the package body and the light emitting device,
wherein the first electrode pad of the light emitting device overlaps with the first through hole in the first frame,
wherein the second electrode pad of the light emitting device overlaps with the second through hole in the second frame,
wherein the first and second electrode pads are spaced apart from each other,
wherein the first recess is in an upper surface of the body portion,
wherein the first resin is in the first recess,
wherein the first recess is located between the first and second through holes and overlaps with a center of the light emitting device,
wherein the first recess extends into the body portion by a first depth, the first depth being less than half of a thickness of the first and second frames,
wherein the first conductor extends from the first electrode pad into the first through hole and terminates within the first through hole without contacting the first frame and without contacting the intermetallic compound layer, and
wherein the second conductor extends from the second electrode pad into the second through hole and terminates within the second through hole without contacting the second frame and without contacting the intermetallic compound layer.

2. The light emitting device package of claim 1, further comprising a cavity in the package body and including an inclined surface,
wherein the light emitting device is disposed within the cavity in the package body.

3. The light emitting device package of claim 1, further comprising first and second lower recesses disposed in the first and second frames, respectively.

4. The light emitting device package of claim 3, wherein the first and second lower recesses are concavely provided in a direction from a lower surface to an upper surface of the first and second frames, respectively.

5. The light emitting device package of claim 3, wherein the first and second lower recesses are separated from the first recess.

6. The light emitting device package of claim 3, wherein the first lower recess at least partially surrounds the first through hole in the first frame, and
wherein the second lower recess at least partially surrounds the second through hole in the second frame.

7. The light emitting device package of claim 6, wherein the first and second lower recesses form a closed loop around the first and second through holes.

8. The light emitting device package of claim 3, further comprising a second resin disposed in the first and second lower recesses.

9. The light emitting device package of claim 3, wherein when viewed from a top surface of the light emitting device, the first and second lower recesses surround the first recess.

10. The light emitting device package of claim 1, wherein the conductive material in the first and second through holes respectively contacts the first and second electrode pads, and a first side surface of the first electrode pad and a second side surface of the second electrode pad facing the first side surface both contact the first resin disposed between the body portion of the package body and the light emitting device.

11. The light emitting device package of claim 1, wherein the conductive material includes Sn.

12. The light emitting device package of claim 1, wherein the body portion extends past an outermost edge of the light emitting device.

13. A light emitting device package comprising:
first and second frames spaced apart from each other;
a package body including a body portion disposed between the first and second frames;
a light emitting device including first and second electrode pads;
a first through hole in the first frame;
a second through hole in the second frame;
a conductive material disposed in the first and second through holes;
a first conductor disposed in the first though hole and in contact with the first electrode pad;
a second conductor disposed in the second though hole and in contact with the second electrode pad;
a first intermetallic compound layer disposed between the conductive material and the first frame;
a second intermetallic compound layer disposed between the conductive material and the second frame;
a cavity in the package body and including an inclined surface;
a first resin disposed between the body portion of the package body and the light emitting device; and
a first recess disposed between the body portion of the package body and the light emitting device and between the first and second frames,
wherein the light emitting device is disposed within the cavity in the package body,
wherein the first electrode pad of the light emitting device overlaps with the first through hole in the first frame,
wherein the second electrode pad of the light emitting device overlaps with the second through hole in the second frame,
wherein the first and second electrode pads are spaced apart from each other,
wherein the first recess is in an upper surface of the body portion,
wherein the first resin is in the first recess,
wherein the first recess is located between the first and second through holes and overlaps with a center of the light emitting device,
wherein the first recess extends into the body portion by a first depth, the first depth being less than half of a thickness of the first and second frames,
wherein the first conductor extends from the first electrode pad into the first through hole and terminates within the first through hole without contacting the first frame and without contacting the first intermetallic compound layer, and
wherein the second conductor extends from the second electrode pad into the second through hole and terminates within the second through hole without contacting the second frame and without contacting the second intermetallic compound layer.

14. The light emitting device package of claim 13, further comprising:

a second recess disposed in the first and second frames; and
a second resin disposed in the second recess,
wherein the second recess at least partially surrounds the first through hole in the first frame and the second through hole in the second frame.

15. The light emitting device package of claim 14, wherein the first recess is connected to the second recess.

16. The light emitting device package of claim 14, wherein the first recess is separated from the second recess.

17. The light emitting device package of claim 14, wherein the second recess surrounds the first recess.

18. The light emitting device package of claim 14, wherein the first depth of the first recess is different than a second depth of the second recess.

19. A light emitting device package comprising:
first and second frames spaced apart from each other;
a package body including a body portion disposed between the first and second frames;
a light emitting device including first and second electrode pads;
a first through hole in the first frame;
a second through hole in the second frame;
a conductive material disposed in the first and second through holes;
a first conductor disposed in the first though hole and in contact with the first electrode pad;
a second conductor disposed in the second though hole and in contact with the second electrode pad;
a cavity in the package body and including an inclined surface;
a first resin disposed between the body portion of the package body and the light emitting device; and
a first recess disposed between the body portion of the package body and the light emitting device and between the first and second frames,
wherein the light emitting device is disposed within the cavity in the package body,
wherein the first electrode pad of the light emitting device overlaps with the first through hole in the first frame,
wherein the second electrode pad of the light emitting device overlaps with the second through hole in the second frame,
wherein the first and second electrode pads are spaced apart from each other,
wherein the first recess is in an upper surface of the body portion,
wherein the first resin is in the first recess,
wherein the first conductor has a peg shape which extends into the first through hole and terminates within the first through hole without contacting the first frame and without contacting an intermetallic compound layer disposed between the conductive material and the first frame, and between the conductive material and the second frame, and
wherein the second conductor has a peg shape which extends into the second through hole and terminates within the second through hole without contacting the second frame and without contacting the intermetallic compound layer.

* * * * *